(12) United States Patent
Kim et al.

(10) Patent No.: US 11,558,986 B2
(45) Date of Patent: Jan. 17, 2023

(54) DISPLAY DEVICE

(71) Applicant: Samsung Display Co., Ltd., Yongin-si (KR)

(72) Inventors: Tae-Eun Kim, Yongin-si (KR); Jeungsoo Kim, Gwangju-si (KR); Junghoon Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/568,534

(22) Filed: Jan. 4, 2022

(65) Prior Publication Data

US 2022/0132706 A1     Apr. 28, 2022

Related U.S. Application Data

(63) Continuation of application No. 17/079,109, filed on Oct. 23, 2020, now Pat. No. 11,252,848, which is a (Continued)

(30) Foreign Application Priority Data

Nov. 22, 2016 (KR) .................. 10-2016-0155982
Nov. 30, 2016 (KR) .................. 10-2016-0162159

(51) Int. Cl.
*H05K 7/20* (2006.01)
*H05K 13/04* (2006.01)

(52) U.S. Cl.
CPC ..... *H05K 7/20954* (2013.01); *H05K 7/20445* (2013.01); *H05K 7/20963* (2013.01); *H05K 13/04* (2013.01)

(58) Field of Classification Search
CPC .. H05K 7/20963; H05K 3/321; H05K 1/0206; H05K 3/305; H05K 7/20954; H05K 7/20445; H05K 13/04; B32B 2305/38
See application file for complete search history.

(56) References Cited

U.S. PATENT DOCUMENTS 4,341,980 A * 7/1982 Noguchi ............... H01J 29/467
                                                    313/422
6,288,489 B1    9/2001 Isohata et al.
(Continued)

FOREIGN PATENT DOCUMENTS

CN    2632713 Y    8/2004
CN    1801256 A    7/2006
(Continued)

OTHER PUBLICATIONS

EPO Extended Search Report dated May 24, 2018, for corresponding European Patent Application No. 17200959.9 (11 pages).
(Continued)

*Primary Examiner* — Michael A Matey
(74) *Attorney, Agent, or Firm* — Lewis Roca Rothgerber Christie LLP

(57) ABSTRACT

A display device includes a display panel to display an image; a heat radiating member at a side portion of the display panel and including a first adhesive layer, a second adhesive layer, and a heat radiating layer between the first adhesive layer and the second adhesive layer; and a heat generating member overlapping the display panel and the heat radiating member when viewed in a plan view, and the heat radiating member includes a first area overlapping the heat generating member and a second area adjacent to the first area when viewed in a plan view, the first adhesive layer and the second adhesive layer are connected to each other through a plurality of through holes defined through the heat radiating layer, and the plurality of through holes includes a through hole in the second area.

8 Claims, 30 Drawing Sheets
(5 of 30 Drawing Sheet(s) Filed in Color)

Related U.S. Application Data continuation of application No. 15/703,918, filed on Sep. 13, 2017, now Pat. No. 10,820,455.

(56) References Cited

U.S. PATENT DOCUMENTS

| | | | |
|---|---|---|---|
| 7,457,121 B2 | 11/2008 | Kim et al. | |
| 7,532,478 B2 | 5/2009 | Jeong | |
| 7,649,737 B2 | 1/2010 | Matsuzawa et al. | |
| 9,177,503 B2 | 11/2015 | Lynch et al. | |
| 9,374,932 B2 | 6/2016 | Hwang | |
| 9,442,542 B2 | 9/2016 | Bhardwaj | |
| 9,575,522 B2 | 2/2017 | Seo et al. | |
| 9,769,964 B2 | 9/2017 | Byun et al. | |
| 9,939,672 B2 | 4/2018 | Kakuda et al. | |
| 9,961,809 B1 | 5/2018 | Yoon et al. | |
| 10,820,455 B2 | 10/2020 | Kim et al. | |
| 2002/0014840 A1* | 2/2002 | Kaneko | H05K 7/20963 313/582 |
| 2003/0071551 A1* | 4/2003 | Kim | H05K 7/20963 313/46 |
| 2003/0230381 A1 | 12/2003 | Watanabe | |
| 2004/0027069 A1* | 2/2004 | Kim | H05K 7/20972 313/582 |
| 2004/0080925 A1 | 4/2004 | Moon | |
| 2004/0257307 A1* | 12/2004 | Bae | H05K 7/20963 345/60 |
| 2005/0062382 A1 | 3/2005 | Kim et al. | |
| 2005/0067963 A1 | 3/2005 | Kim et al. | |
| 2005/0077835 A1* | 4/2005 | Kim | H05K 7/20963 315/169.4 |
| 2005/0082963 A1 | 4/2005 | Miyazaki et al. | |
| 2005/0117293 A1 | 6/2005 | Yokoyama | |
| 2006/0087233 A1* | 4/2006 | Kim | H05K 7/20963 313/46 |
| 2006/0098412 A1* | 5/2006 | Kim | H05K 7/20963 361/704 |
| 2006/0146224 A1 | 7/2006 | Lee et al. | |
| 2007/0054109 A1* | 3/2007 | Lin | G02F 1/133385 428/317.1 |
| 2007/0109753 A1* | 5/2007 | Bae | H05K 7/20963 361/724 |
| 2007/0153548 A1 | 7/2007 | Hamada et al. | |
| 2007/0189011 A1* | 8/2007 | Song | F21V 29/71 362/294 |
| 2007/0211205 A1 | 9/2007 | Shibata | |
| 2008/0203880 A1* | 8/2008 | Kim | H05K 7/20963 313/45 |
| 2009/0009047 A1 | 1/2009 | Yanagawa et al. | |
| 2009/0316389 A1 | 12/2009 | Park et al. | |
| 2010/0244005 A1 | 9/2010 | Gyoda | |
| 2010/0321897 A1 | 12/2010 | Hill et al. | |
| 2011/0261286 A1 | 10/2011 | Choi | |
| 2012/0002118 A1 | 1/2012 | Imajo et al. | |
| 2013/0120290 A1* | 5/2013 | Yu | G06F 3/0488 345/173 |
| 2013/0163285 A1* | 6/2013 | Kasuga | G02B 6/0085 362/613 |
| 2013/0170116 A1* | 7/2013 | In | G02F 1/133308 361/679.01 |
| 2014/0218617 A1* | 8/2014 | Hongo | H04N 5/64 362/609 |
| 2016/0027718 A1 | 1/2016 | Park et al. | |
| 2016/0055793 A1* | 2/2016 | Jang | B32B 5/18 428/408 |
| 2016/0125225 A1* | 5/2016 | Ebihara | G06F 3/0446 382/115 |
| 2016/0187985 A1* | 6/2016 | Lim | H01L 41/193 345/173 |
| 2016/0212890 A1 | 7/2016 | Jeong et al. | |
| 2016/0223852 A1 | 8/2016 | Nishimura et al. | |
| 2017/0139123 A1 | 5/2017 | Ochi et al. | |
| 2017/0162820 A1* | 6/2017 | Masumoto | G09G 3/3208 |
| 2017/0186992 A1 | 6/2017 | Lee et al. | |
| 2017/0313078 A1 | 11/2017 | Ueki et al. | |
| 2017/0318694 A1 | 11/2017 | Yun et al. | |
| 2017/0351145 A1 | 12/2017 | Isono et al. | |
| 2018/0162098 A1* | 6/2018 | Joo | B32B 9/007 |

FOREIGN PATENT DOCUMENTS

| | | |
|---|---|---|
| CN | 1848207 A | 10/2006 |
| CN | 101038709 A | 9/2007 |
| CN | 201749267 U | 2/2011 |
| CN | 103945675 A | 7/2014 |
| CN | 104427048 A | 3/2015 |
| CN | 104737634 A | 6/2015 |
| CN | 104820314 A | 8/2015 |
| CN | 205103525 U | 3/2016 |
| CN | 105828572 A | 8/2016 |
| CN | 108093602 B | 1/2021 |
| EP | 2 621 249 A1 | 7/2013 |
| JP | 2-58358 A | 2/1990 |
| JP | 2001-358264 A | 12/2001 |
| JP | 2010-175680 | 8/2010 |
| KR | 10-0560201 B1 | 3/2006 |
| KR | 10-0969194 B1 | 7/2010 |
| KR | 10-1255302 B1 | 4/2013 |
| KR | 10-2013-0043720 | 5/2013 |
| KR | 2013-0080418 A | 7/2013 |
| WO | WO 2016/072429 A1 | 5/2016 |
| WO | WO 2016/125947 A1 | 8/2016 |
| WO | WO 2016/136146 | 9/2016 |

OTHER PUBLICATIONS

Chinese Examination Report dated May 26, 2022 issued in corresponding Chinese Patent Application No. 202011644102.9, 9 pages.

\* cited by examiner

DISPLAY DEVICE

CROSS-REFERENCE TO RELATED APPLICATIONS

This application is a continuation of U.S. patent application Ser. No. 17/079,109, filed on Oct. 23, 2020, which is a continuation of U.S. patent application Ser. No. 15/703,918, filed on Sep. 13, 2017, now U.S. Pat. No. 10,820,455, which claims priority to and the benefit of Korean Patent Applications Nos. 10-2016-0155982, filed on Nov. 22, 2016 in the Korean Intellectual Property Office, and 10-2016-0162159, filed on Nov. 30, 2016 in the Korean Intellectual Property Office, the entire contents of all of which are hereby incorporated by reference.

BACKGROUND

1. Field

Aspects of embodiments of the present disclosure relate to a display device and, more particularly, to a display device having improved reliability.

2. Description of the Related Art

A display device displays an image in response to electrical signals to provide a user with information. The display device includes various components, such as a display panel, a driving circuit, etc., to process electrical signals used to drive the display device. The components generate heat while being activated in response to the electrical signals. The display device includes a heat radiating member to discharge the heat. The heat radiating member prevents other components from being damaged due to the heat generated from the components.

SUMMARY

According to an aspect of the present disclosure, a display device is capable of preventing or substantially preventing layers from being delaminated due to deterioration of adhesive force and improving reliability in coupling of a heat radiating member.

According to one or more embodiments, a display device includes a display panel to display an image, a heat radiating member at a side portion of the display panel and including a first adhesive layer, a second adhesive layer, and a heat radiating layer between the first adhesive layer and the second adhesive layer, and a heat generating member overlapping with the display panel and the heat radiating member when viewed in a plan view. The heat radiating member includes a first area overlapping the heat generating member and a second area adjacent to the first area when viewed in a plan view, the first adhesive layer and the second adhesive layer are connected to each other through a plurality of through holes defined through the heat radiating layer, and the plurality of through holes includes a through hole in at least the second area.

The heat generating member may include a driving device mounted on the display panel to apply an electrical signal to the display panel.

The heat generating member may include a circuit board including a substrate connected to the display panel and a driving device mounted on the substrate to apply an electrical signal to the display panel, and the heat radiating member may be arranged between the circuit board and the display panel.

The heat generating member may include a power supply member arranged under the heat radiating member to supply a power to the display panel.

Each of the through holes may have a circular shape, an oval shape, a polygonal shape, a closed loop shape, or combination thereof when viewed in a plan view.

Each of the through holes may have a diameter equal to or greater than about 2.4 mm, the diameter corresponding to a diameter of a circumscribed circle of the through hole.

A distance between two adjacent through holes among the plurality of through holes may be equal to or greater than about 4 mm.

The through holes may include a first through hole arranged in the first area and a second through hole arranged in the second area.

The first through hole may have a cross-sectional area equal to or smaller than a cross-sectional area of the second through hole.

Each of the first through hole and the second through hole may be provided in a plural number, and a ratio of the first through holes to the first area may be smaller than a ratio of the second through holes to the second area.

The through holes may be arranged along an edge of the heat radiating layer.

At least one of the first adhesive layer and the second adhesive layer may include a double-sided adhesive tape.

The heat radiating member may further include a metal layer on a surface of at least one of the first adhesive layer and the second adhesive layer.

The metal layer may include copper.

The heat radiating member may further include an insulating layer on a surface of at least one of the first adhesive layer and the second adhesive layer.

The insulating layer may include at least one of polyimide and polyethylene terephthalate.

The display device may further include a third adhesive layer between the second adhesive layer and the heat radiating layer, the third adhesive layer may be penetrated by the through holes, and the second adhesive layer may be connected to the first adhesive layer through the through holes.

The display device may further include a frame member surrounding an edge of the heat radiating member, and the display panel may entirely cover the heat radiating member and the frame member.

The frame member may be spaced apart from an outer line of the heat radiating member when viewed in a cross section.

The display device may further include a shock relief member disposed between the display panel and the heat radiating member, and the shock relief member may entirely cover the heat radiating member and the frame member when viewed in a plan view.

The second adhesive layer may further include a plurality of concave portions respectively overlapping the through holes.

Some of the through holes may include a space surrounded by the first adhesive layer, the second adhesive layer, and the heat radiating layer.

According to the above, the adhesive characteristics between the heat radiating member and components disposed adjacent to the heat radiating member is enhanced, and thus the display device may have improved coupling reliability. In addition, the heat radiating member of the display device may concurrently or simultaneously have the heat discharging characteristics and the adhesive characteristics.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects of the present disclosure will become readily apparent by reference to the following description when considered in conjunction with the accompanying drawings, wherein.

DETAILED DESCRIPTION

Herein, some embodiments of the present invention will be explained in further detail with reference to the accompanying drawings.

Figure 1A:
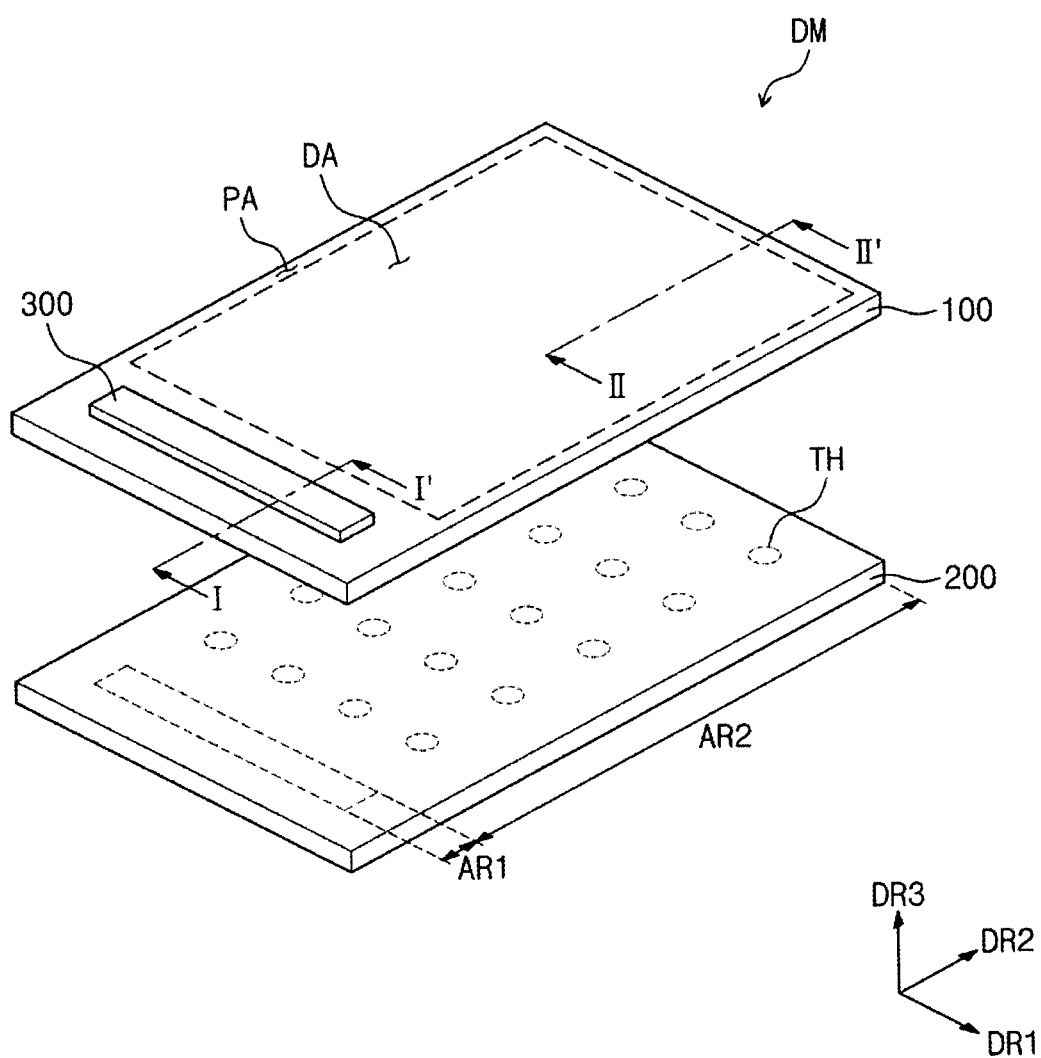
FIG. 1A is an exploded perspective view showing a display device according to an exemplary embodiment of the present disclosure.
Figure 1B:
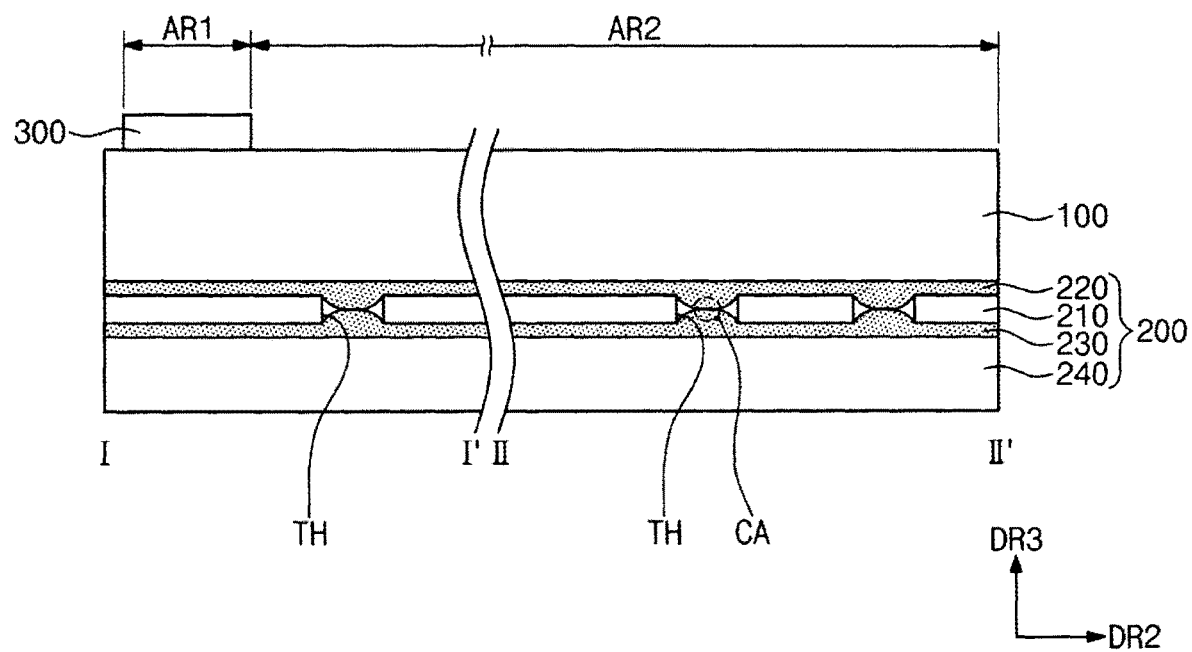
FIG. 1B is a cross-sectional view showing a portion of the display device shown in FIG. 1A.

FIG. 1A is an exploded perspective view showing a display device DM according to an exemplary embodiment of the present disclosure; and FIG. 1B is a cross-sectional view showing a portion of the display device DM shown in FIG. 1A. For the convenience of explanation, FIG. 1B shows the cross-sectional view taken along lines I-I' and II-II' shown in FIG. 1A. Herein, the display device DM will be described in further detail with reference to FIGS. 1A and 1B.

The display device DM includes a display panel 100, a heat radiating member 200, and a heat generating member 300. In the present exemplary embodiment, the heat generating member 300 is positioned in the display panel 100.

The display panel 100 displays an image in response to electrical signals. The display panel 100 is activated by the electrical signals. Accordingly, the display panel 100 may be one of heat generating members generating heat while being activated.

The display panel 100 includes a display area DA and a peripheral area PA on a plane surface defined by a first direction DR1 and a second direction DR2.

The display area DA may include a plurality of pixels arranged therein. Accordingly, the image is displayed through the display area DA. A user receives information from the image displayed through the display area DA.

The peripheral area PA is disposed adjacent to the display area DA. In the present exemplary embodiment, the peripheral area PA has a shape surrounding an edge of the display area DA. However, the peripheral area PA may be disposed adjacent to a portion of the edge of the display area DA according to another embodiment.

Although not shown in the figures, the display panel 100 may further include a touch sensor to sense a touch event applied thereto from the outside of the display panel 100 or a pressure sensor to sense a pressure applied thereto from the outside of the display panel 100.

The heat radiating member 200 may be disposed on a side portion of the display panel 200. The heat radiating member 200 may be disposed on the side portion opposite to a side portion in which the image is displayed of the display panel 100. In the present exemplary embodiment, the heat radiating member 200 is disposed on a lower portion of the display panel 100.

The heat radiating member 200 discharges the heat generated from heat generating members disposed adjacent thereto. Accordingly, the heat generated from the heat generating members disposed adjacent to the heat radiating member 200 may be easily discharged through the heat radiating member 200, and thus the heat generating members may be stably operated after a drive time (e.g., a predetermined drive time) elapses. The heat radiating member 200 may include a heat radiating layer 210, a first adhesive layer 220, a second adhesive layer 230, and an outer layer 240. The heat radiating layer 210 may be disposed between the first adhesive layer 220 and the second adhesive layer 230.

The heat radiating layer 210 may include a material having high heat conductivity. As the heat conductivity of the heat radiating layer 210 becomes high, heat discharging characteristics of the heat radiating member 200 may be improved. For instance, the heat radiating layer 210 may include an organic material having high heat conductivity, e.g., graphite, or a metal material.

The heat radiating layer 210 may include a plurality of through holes TH defined therethrough. The through holes TH penetrate through the heat radiating layer 210. The through holes TH may be arranged in a variety of shapes when viewed in a plan view. The arrangement of the through holes TH will be described in further detail later herein.

The first adhesive layer 220 is disposed on a surface of the heat radiating layer 210. The first adhesive layer 220 may be disposed between the heat radiating layer 210 and the display panel 100. The first adhesive layer 220 may make contact with the surface of the heat radiating layer 210.

The heat radiating member 200 may be attached to a member disposed thereon by the first adhesive layer 220. In the present exemplary embodiment, the first adhesive layer 220 may directly make contact with the display panel 100.

The second adhesive layer 230 is disposed on the other surface of the heat radiating layer 210. The second adhesive layer 230 may be disposed between the heat radiating layer 210 and the outer layer 240. The second adhesive layer 230 may make contact with the other surface of the heat radiating layer 210.

In the present exemplary embodiment, portions of the first adhesive layer 220 may protrude into the through holes TH, respectively. Portions of the second adhesive layer 230 may protrude into the through holes TH, respectively. The protruded portions of the first adhesive layer 220 may make contact with the protruded portions of the second adhesive layer 230 in contact areas CA, respectively.

The contact areas CA overlap the through holes TH when viewed in a plan view. Since each of the first adhesive layer 220 and the second adhesive layer 230 has an adhesive force, the first adhesive layer 220 and the second adhesive layer 230 may be attached to each other in the contact areas CA.

The contact areas CA may be defined in the through holes TH, respectively. Accordingly, the first adhesive layer 220 and the second adhesive layer 230 may be connected to each other through the through holes TH.

Thus, a same effect may be obtained in the areas through which the through holes TH are defined as that obtained by means of arranging a plurality of adhesive members. Since the heat radiating member 200 according to the present exemplary embodiment further includes the through holes TH, the adhesive force may be improved without adding the adhesive member.

For the convenience of explanation, Table 1 shows a release force of the heat radiating member 200 according to the present exemplary embodiment and a release force of a comparison example.

TABLE 1

| | Release force (gF/25mm) | | | | | |
|---|---|---|---|---|---|---|
| | #1 | #2 | #3 | #4 | #5 | Average |
| Comparison example (CC) | 41.4 | 48.1 | 43 | 45.7 | 46.5 | 44.94 |
| Embodiment example (EX) | 74.7 | 72.2 | 82.5 | 78.6 | 79.4 | 77.48 |

Table 1 shows result values obtained by performing experiments on five samples each in which the comparison example CC is attached to an object and on five samples each in which the embodiment example EX is attached to an object. All components and conditions of the experiments are the same except for the through holes TH.

Referring to Table 1, the average value of the release force of the embodiment example EX of the present disclosure is about 1.7 times greater than the average value of the release force of the comparison example CC. Accordingly, the heat radiating member 200 according to the exemplary embodiment of the present disclosure may have improved adhesive characteristics by defining the through holes TH through the heat radiating member 200.

The outer layer 240 is disposed under and attached to the second adhesive layer 230. The outer layer 240 prevents the second adhesive layer 230 from making contact with an outside environment and protects the heat radiating layer 210. However, in an embodiment, the outer layer 240 may be omitted from the heat radiating member 200.

In an embodiment, for example, the outer layer 240 may be a release film. Accordingly, the outer layer 240 may prevent or substantially prevent a deterioration of adhesive characteristics of the second adhesive layer 230, which may be caused by an external contaminant during a process. Then, the outer layer 240 may be removed from the second adhesive layer 230, and the second adhesive layer 230 may attach an external member separately provided to the heat radiating member 200.

As another example, the outer layer 240 may be a protective member. Accordingly, the outer layer 240 may include a material having rigidity (e.g., a predetermined rigidity). The outer layer 240 may protect the heat radiating layer 210, and the separately provided external member may be attached to the outer layer 240 by an adhesive layer separately provided.

The heat generating member 300 may be a driving circuit mounted on the display panel 100. The driving circuit 300 applies electrical signals to the display panel 100 or processes electrical signals from the display panel 100. The driving circuit 300 may be provided in an integrated chip form or in a structure configured to include a conductive layer and an insulating layer.

The driving circuit 300 may include a plurality of driving devices and a plurality of signal lines connecting the driving devices to each other or the driving devices to the pixels of the display panel 100. Accordingly, the driving circuit 300 may be one of heat generating members that generate heat while operating.

In the present exemplary embodiment, the heat radiating member 200 may be divided into a first area AR1 and a second area AR2 when viewed in a plan view. The first area AR1 may be an area of the heat radiating member 200 which overlaps the heat generating member 300. The heat radiating member 200 may be adjacent to the display panel 100 and the heat generating member 300 in the first area AR1 when viewed in a thickness direction DR3 (herein, referred to as a "third direction").

The second area AR2 is disposed adjacent to the first area AR1. The second area AR2 may not overlap the heat generating member 300 when viewed in a plan view. The heat radiating member 200 may be disposed adjacent to the display panel 100 in the second area AR2. Thus, the heat generated from the first area AR1 may be higher than that generated from the second area AR2.

The through holes TH may be arranged in at least the second area AR2. In the present exemplary embodiment, the through holes TH may be arranged in the second area AR2 and not overlap the first area AR1.

Since the through holes TH are defined through the heat radiating layer 210, the through holes TH may be mainly arranged in an area adjacent to the heat generating member that generates a relatively low heat. Accordingly, the adhesive characteristics of the heat radiating member 200, which is improved by the through holes TH, may be prevented or substantially prevented from being deteriorated due to the heat generated from the display device DM. Thus, the heat radiating member 200 may improve the heat discharging characteristics in a high heat generating area and improve the adhesive characteristics in a low heat generating area.

According to the display device DM according to the present exemplary embodiment, the through holes TH are defined through the heat radiating member 200, and thus the adhesive characteristics of the heat radiating member 200 may be improved. In addition, since the arrangement of the through holes TH is differently determined depending on a heat generation degree, the heat discharging characteristics and the adhesive characteristics may be selectively controlled for each area. Accordingly, the heat discharging characteristics and the adhesive characteristics of the heat radiating member 200 may be substantially and simultaneously improved.

Figure 2A:
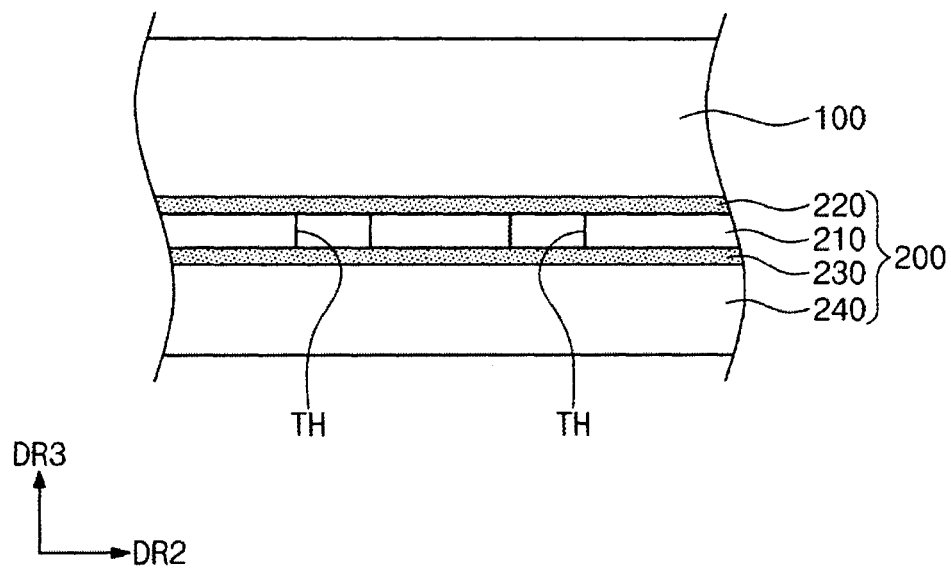
FIGS. 2A to 2C are cross-sectional views showing portions of a display device according to an exemplary embodiment of the present disclosure.
Figure 2B:
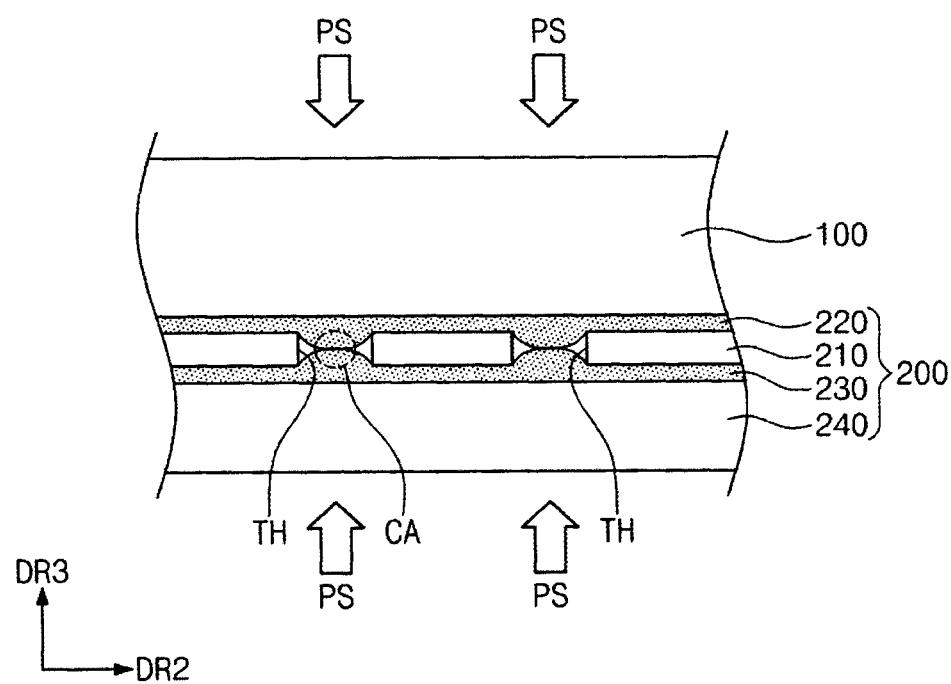
Figure 2C:
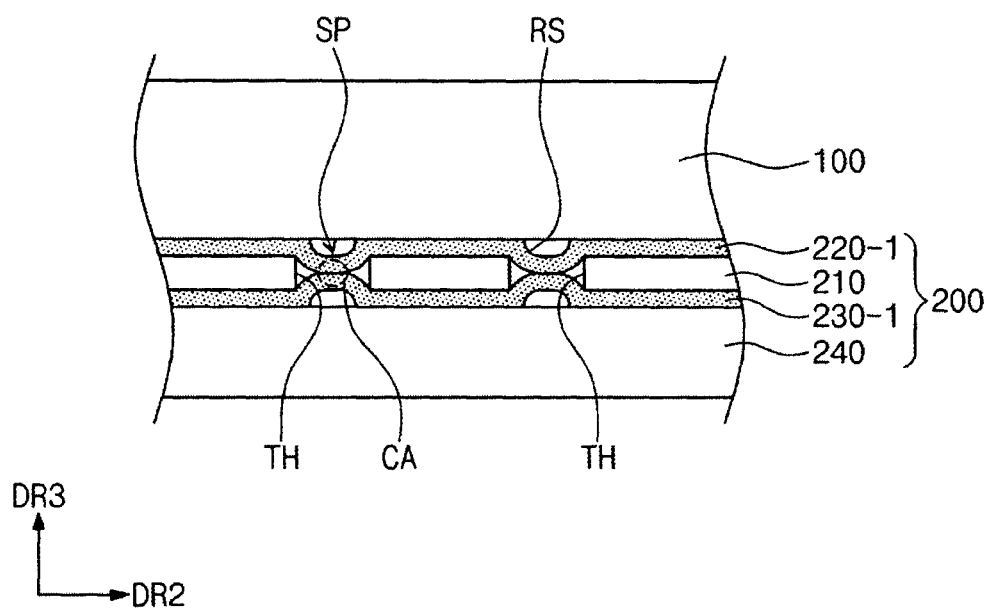

FIGS. 2A to 2C are cross-sectional views showing portions of a display device according to an exemplary embodiment of the present disclosure. For the convenience of explanation, FIG. 2A shows the heat radiating member 200 temporarily attached to the display panel 100; and FIGS. 2B and 2C show the heat radiating member 200 completely attached to the display panel 100. Hereinafter, the display device will be described in further detail with reference to FIGS. 2A to 2C.

Referring to FIG. 2A, in the heat radiating member 200 temporarily attached to the display panel 100, the first adhesive layer 220 may not make contact with the second adhesive layer 230. The first adhesive layer 220 may be spaced apart from the second adhesive layer 230 in the third direction DR3 such that the through holes TH are positioned between the first and second adhesive layers 220 and 230. In this case, a coupling force acting between the display panel 100 and the heat radiating member 200 may correspond to an adhesive force of the first adhesive layer 220.

Then, as shown in FIG. 2B, when a pressure (e.g., a predetermined pressure) PS is applied to the first and second adhesive layers 220 and 230 after the temporary attachment, at least portions of the first and second adhesive layers 220 and 230 may protrude into the through holes TH.

The shape of the first and second adhesive layers 220 and 230 having flexibility may be deformed by the pressure PS applied thereto or a heat generated by the pressure PS, and thus the first and second adhesive layers 220 and 230 may partially enter into the through holes TH. The protruded portions of the first adhesive layer 220 may make contact with the protruded portions of the second adhesive layer 230, respectively.

The first and second adhesive layers 220 and 230 make contact with each other to define the contact areas CA. A cross-sectional size of the contact area CA may be equal to or smaller than a cross-sectional size of the through hole TH when viewed in a plan view.

Accordingly, the first and second adhesive layers 220 and 230 are connected to each other through the through holes TH. In this case, the coupling force acting between the display panel 100 and the heat radiating member 200 may correspond to the adhesive force between the first and second adhesive layers 220 and 230.

In an embodiment, as shown in FIG. 2C, at least one of a first adhesive layer 220-1 and a second adhesive layer 230-1 may include a concave portion RS defined therein. The concave portion RS may be defined in an area corresponding to at least one of the through holes TH.

In an embodiment, the concave portion RS is defined in each of the first and second adhesive layers 220-1 and 230-1, and the first and second adhesive layers 220-1 and 230-1 may have a constant thickness throughout and make contact with each other through the through holes TH.

In this case, a space (e.g., a predetermined space) SP may be defined between the display panel 100 and the first adhesive layer 220-1. The adhesive area reduced by the space SP may be compensated by the improvement of the adhesive force in an area adjacent to the space SP.

In an embodiment, at least one of the first adhesive layer 220 and the second adhesive layer 230 may be, but is not limited to, a double-sided adhesive tape. Accordingly, an area not filled with the first and the second adhesive layers 220 and 230 may exist in the through holes TH. The area not filled with the first and the second adhesive layers 220 and 230 may be surrounded by the first adhesive layer 220, the second adhesive layer 230, and the heat radiating layer 210. However, the through holes TH may be fully filled with the first and second adhesive layers 220 and 230 in accordance with the applied pressure PS and the thickness of at least one of the first and second adhesive layers 220 and 230 according to other embodiments.

FIGS. 3A to 3D are plan views showing heat radiating members of a display device according to some exemplary embodiments of the present disclosure. For the convenience of explanation, FIGS. 3A to 3D show the heat generating member 300 (refer to FIG. 1A) disposed to overlap each of heat radiating members 200-A, 200-B, 200-C, and 200-D as a dashed line. Herein, the heat radiating members 200-A, 200-B, 200-C, and 200-D will be described in further detail with reference to FIGS. 3A to 3D.

Figure 3A:
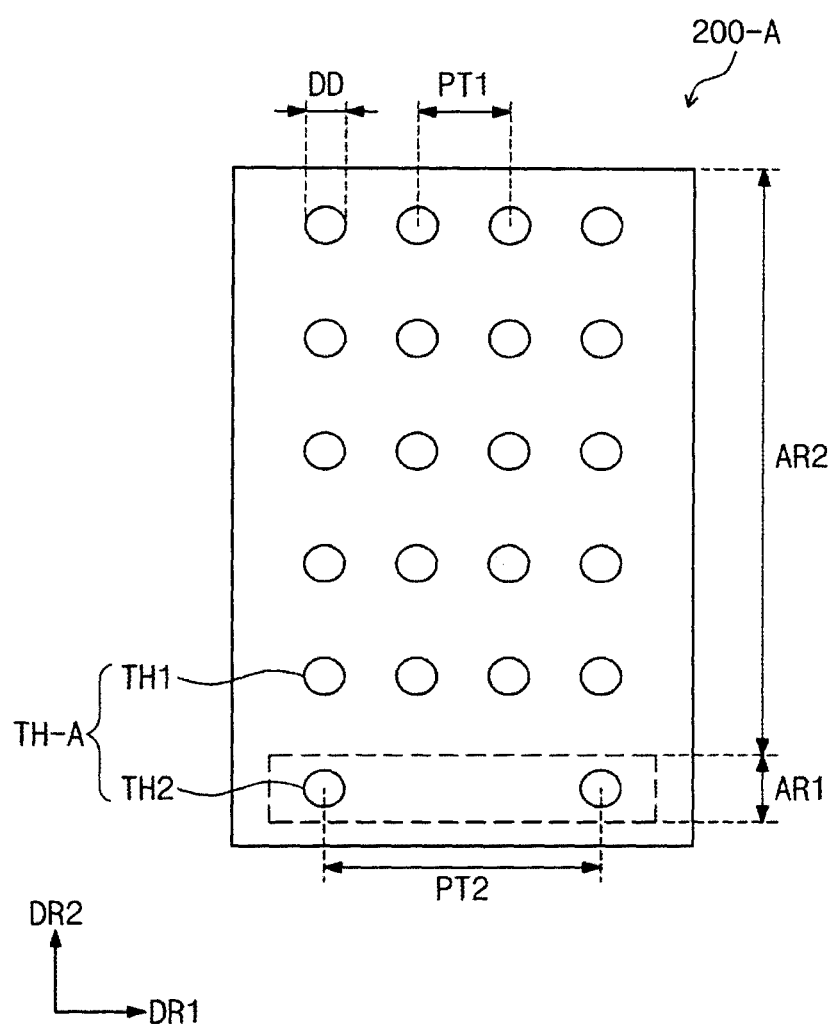
FIGS. 3A to 3D are plan views showing heat radiating members of a display device, according to some exemplary embodiments of the present disclosure.

Referring to FIG. 3A, a plurality of through holes TH-A defined through the heat radiating member 200-A may include a first through hole TH1 defined in the second area AR2 and a second through hole TH2 defined in the first area AR1.

The first through hole TH1 is provided in a plural number and has a circular shape having a diameter (e.g., a predetermined diameter) DD. Each of the first through holes TH1 may have a cross-sectional area increasing as the diameter DD increases, and the adhesive characteristics of the heat radiating member 200-A may be improved.

Referring to FIGS. 3A to 3D, the first through holes TH1 may each have same sizes as each other. However, according to another embodiment, the first through holes TH1 may have different sizes from each other. In this embodiment, each of the diameters DD may be different from each other.

The diameter DD may be designed in various ways and should not be limited to a specific embodiment.

One of the first through holes TH1 may have various sizes as long as the portion of the first adhesive layer 220 (refer to FIG. 1B) and the portion of the second adhesive layer 230 (refer to FIG. 1B) make contact with each other in the one of the first through holes TH1. In an embodiment, for example, the diameter DD may be equal to or greater than about 2.4 mm.

As the diameter DD of each of the first through holes TH1 decreases, the area of the heat radiating layer 210 (refer to FIG. 1B) increases and the heat discharging characteristics of the heat radiating member 200-A may be improved. Accordingly, a maximum value of the diameter DD of each of the first through holes TH1 may indicate a size to secure a minimum area of the heat radiating layer 210 that performs the desired heat discharging function.

The first through holes TH1 are positioned spaced apart from the first through holes TH1 adjacent thereto. For instance, the first through holes TH1 are spaced apart from the first through holes TH1 adjacent thereto by a first pitch PT1 in the first direction DR1.

The first pitch PT1 may have any of various values. In an embodiment, for example, the first pitch PT1 may be equal to or smaller than about 4 mm. As the first pitch PT1 increases, the heat discharging area increases. By contrast, as the first pitch PT1 decreases, the coupling force of the heat radiating member 200 to be attached to other components may be improved.

The first pitch PT1 may be defined in various direction. For instance, the first pitch PT1 may be defined in the second direction DR2, or in a direction oblique to the first direction DR1. The first pitch PT1 may be uniform in length or may be non-uniform (e.g., random) in length. The first pitch PT1 may be designed in various ways and is not limited to a specific embodiment.

The second through hole TH2 is positioned in the first area AR1. In an embodiment, the second through hole TH2 is provided in a plural number, and the second through holes TH2 are arranged in the first direction DR1 at a second pitch PT2. In the present exemplary embodiment, the second pitch PT2 is greater than the first pitch PT1. In addition, according to the present exemplary embodiment, the second through holes TH2 are positioned spaced apart from the first through holes TH1 in the second direction DR2, and the distance between one of the second through holes TH2 and one of the first through holes TH1 adjacent to each other in the second direction DR2 is smaller than the second pitch PT2.

However, according to another embodiment, the second pitch PT2 may be designed independent from the first pitch PT1. Accordingly, the second pitch PT2 may be defined in any of various directions. For instance, the second pitch PT2 may be defined in the second direction DR2, or in a direction oblique to the first direction DR1. The second pitch PT2 may be uniform in length or may be non-uniform (e.g., random) in length. The second pitch PT2 may be designed in various ways and is not limited to a specific embodiment.

In the present exemplary embodiment, each of the second through holes TH2 has the same diameter DD as that of each of the first through holes TH1, but the present disclosure is not limited thereto or thereby. That is, the diameters of the second through holes TH2 may be designed independent from the first through holes TH1, may have various sizes, and are not limited to a specific embodiment.

In an embodiment, the number of the second through holes TH2 in the first area AR1 may be smaller than the number of the first through holes TH1 in the second area AR2. In an embodiment, a density of the second through holes TH2 in the first area AR1 may be smaller than a density of the first through holes TH1 in the second area AR2.

As described above, the first area AR1 is relatively more greatly influenced by the heat than the second area AR2. The number of the through holes, the density of the through holes, and the distribution of the through holes may exert influences on the adhesive characteristics and the heat discharging characteristics. Accordingly, the number or density of the second through holes TH2 arranged in the first area AR1 relatively more greatly influenced by the heat may be relatively smaller than the number or density of the first through holes TH1 arranged in the second area AR2.

Figure 3B:
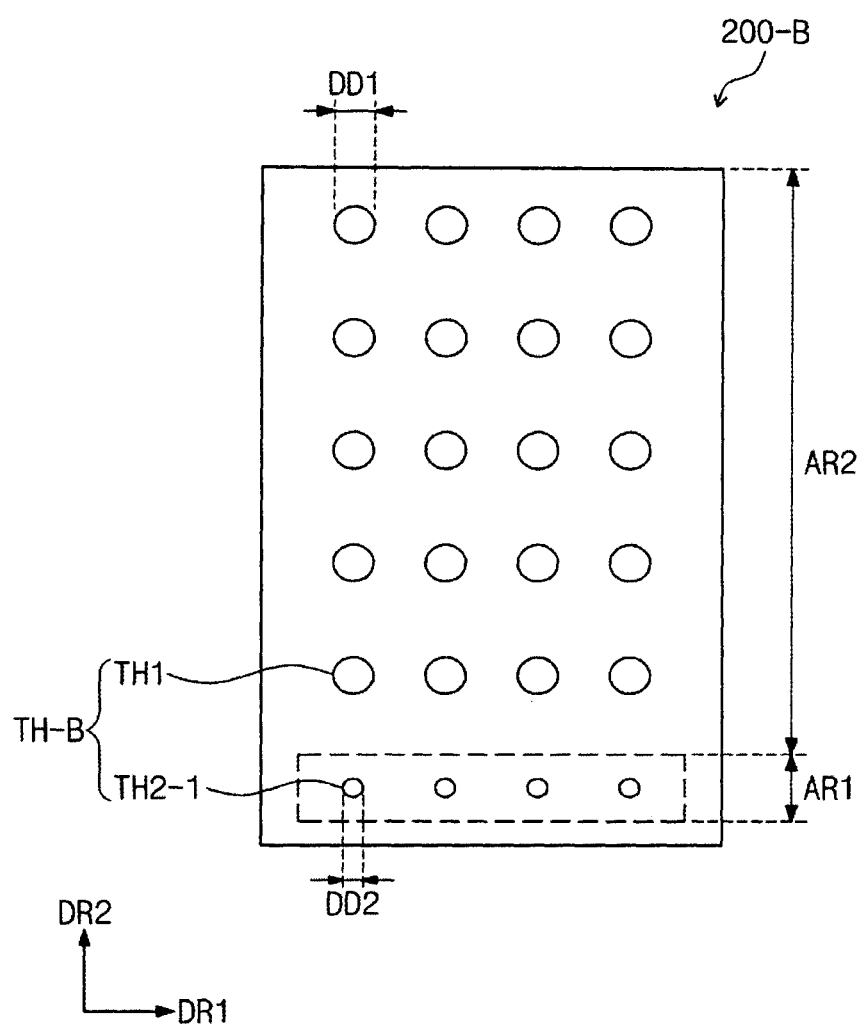

Referring to FIG. 3B, a plurality of through holes TH-B defined through the heat radiating member 200-B may include a first through hole TH1 and a second through hole TH2-1. Each of the first through hole TH1 and the second through hole TH2-1 is provided in plural. The first through holes TH1 corresponds to the first through holes TH1 shown in FIG. 3A, and thus further detailed descriptions of the first through holes TH1 will be omitted.

The first through holes TH1 and the second through holes TH2-1 may have different diameters from each other. In an embodiment, each of the second through holes TH2-1 has a circular shape having a second diameter DD2. The second diameter DD2 may be greater than a first diameter DD1 of one the first through holes TH1.

In an embodiment, the second through holes TH2-1 may be spaced apart from the second through holes TH2-1 adjacent thereto at the same distance as the distance between the first through holes TH1 and the first through holes TH1 adjacent thereto. Accordingly, an arrangement in the first direction DR1 of the second through holes TH2-1 may correspond to an arrangement in the first direction DR1 of the first through holes TH1.

In the heat radiating member 200-B according to the present exemplary embodiment, each of the second through holes TH2-1 having the relatively small second diameter DD2 is positioned in the first area AR1 relatively more greatly influenced by the heat, and thus the heat discharging characteristics of the heat radiating member 200-B may be prevented or substantially prevented from being deteriorated and the adhesive characteristics of the heat radiating member 200-B may be improved.

Figure 3C:
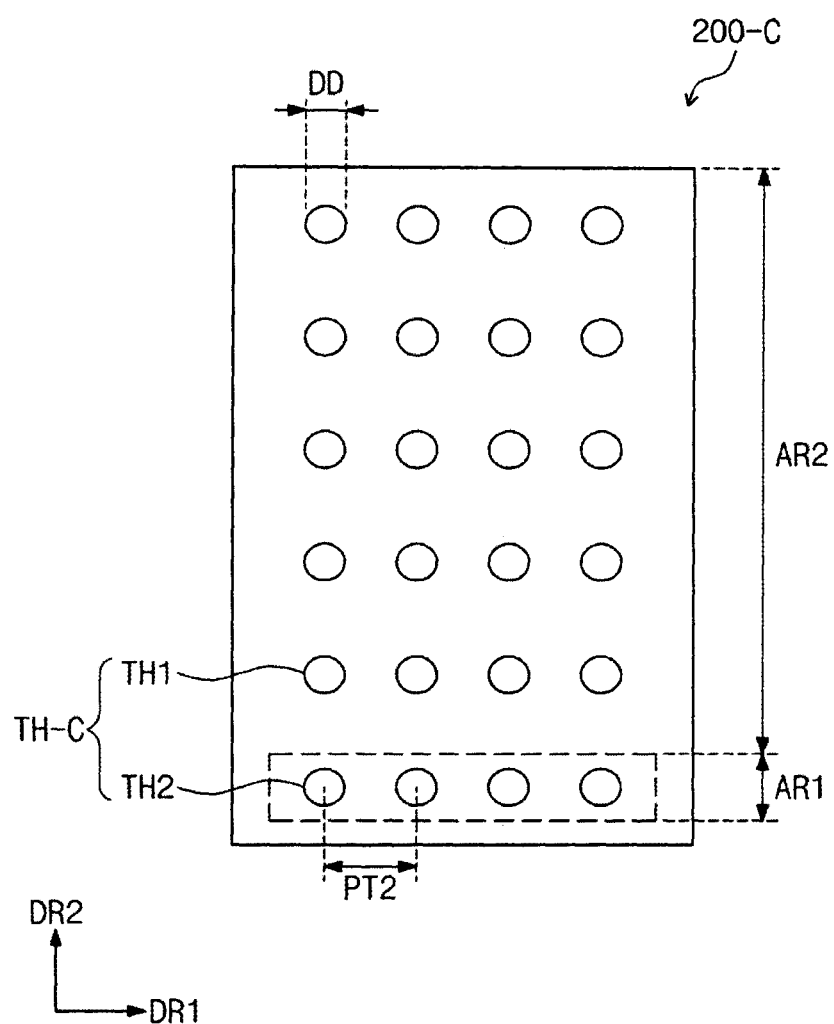

Referring to FIG. 3C, a plurality of through holes TH-C of the heat radiating member 200-C may be uniformly arranged in the heat radiating member 200-C. A plurality of second through holes TH2 may be arranged corresponding to a plurality of first through holes TH1. A second pitch PT2 may substantially be the same as a pitch of the first through holes TH1. Therefore, the first through holes TH1 and the second through holes TH2 may be arranged in a matrix.

Figure 3D:
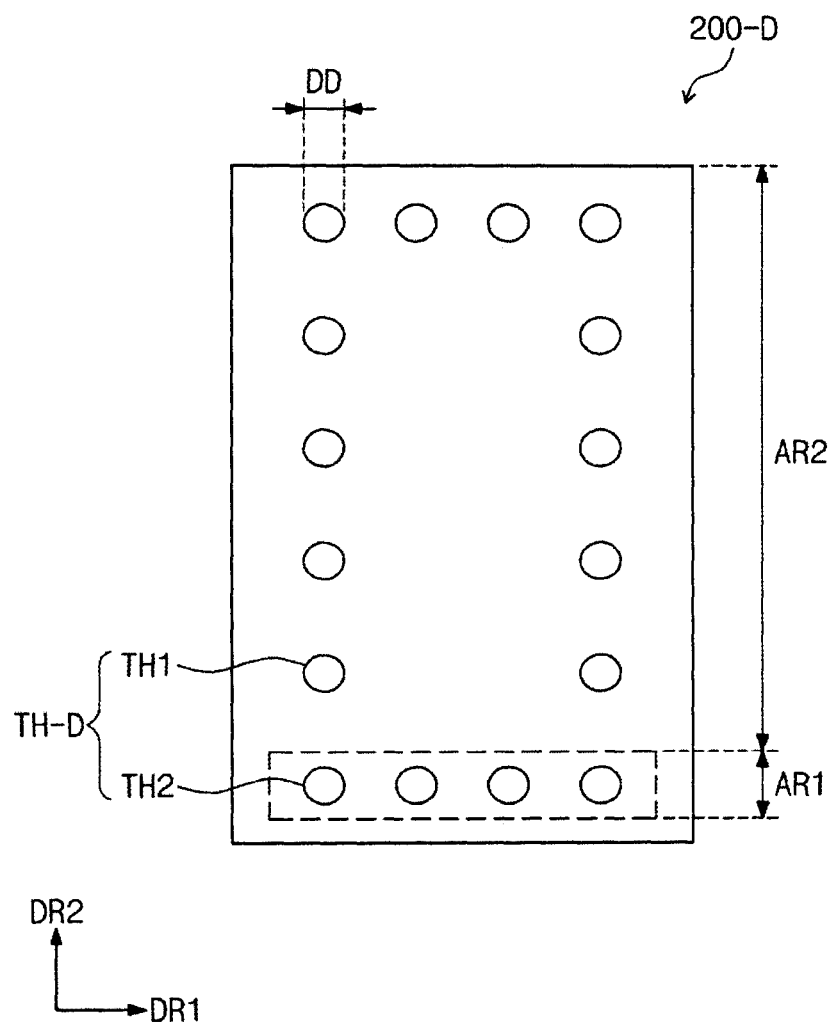

Referring to FIG. 3D, a plurality of through holes TH-D of the heat radiating member 200-D may be arranged along an edge (e.g., at all sides) of the heat radiating member 200-D. First and second through holes TH1 and TH2 are arranged to form a frame shape when viewed in a plan view. Accordingly, the heat radiating member 200-D may have improved adhesive characteristics along the edge in which a possibility of penetration of a foreign substance is relatively high and may maintain the heat discharging characteristics in a center area in which the heat generation is relatively high.

The through holes may be defined through the heat radiating members 200-A, 200-B, 200-C, and 200-D according to the embodiments in various forms. The heat radiating members 200-A, 200-B, 200-C, and 200-D may easily control the heat discharging characteristics and the adhesive characteristics by controlling the arrangement or density of the through holes.

Figure 4A:
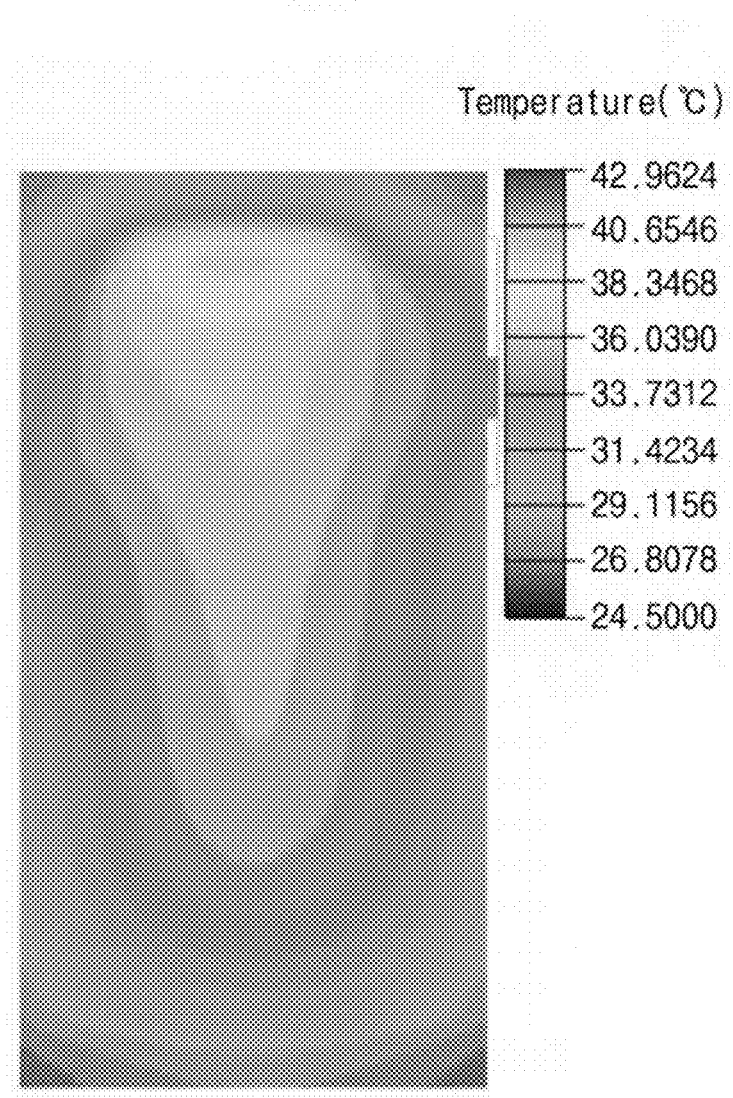
FIG. 4A is a view showing a temperature distribution of a comparison example.
Figure 4B:
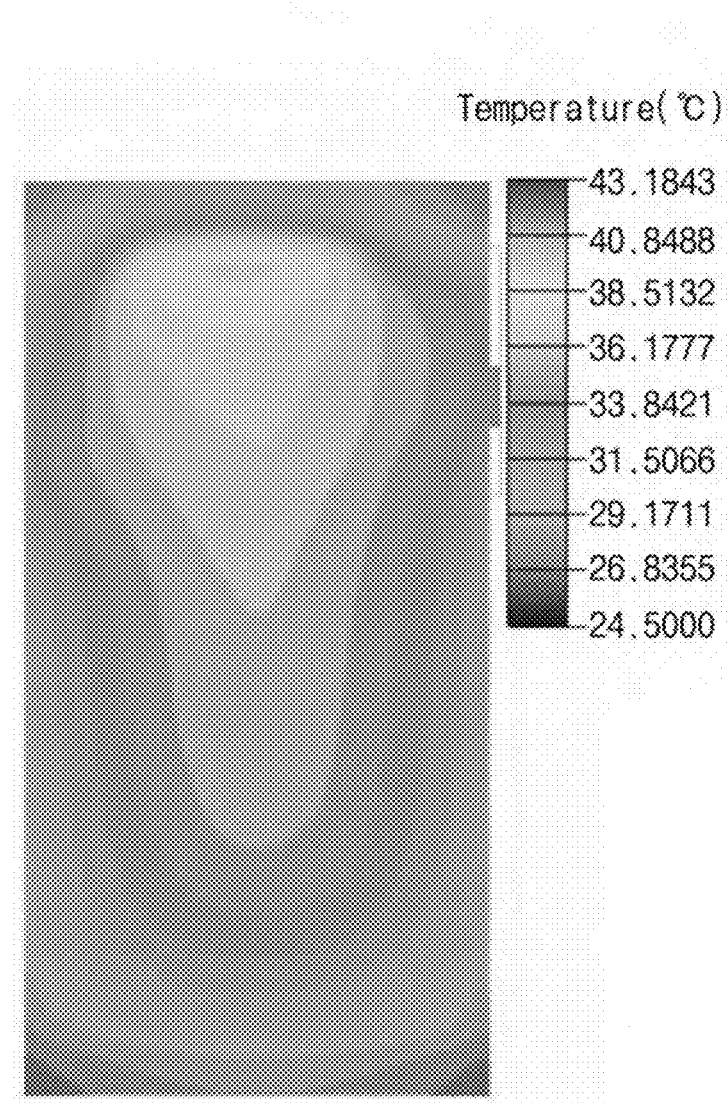
FIG. 4B is a view showing a temperature distribution of a display device according to an exemplary embodiment of the present disclosure.

FIG. 4A is a view showing a temperature distribution of a comparison example; and FIG. 4B is a view showing a temperature distribution of a display device according to an exemplary embodiment of the present disclosure.

FIG. 4A shows the temperature distribution of a display device including a heat discharging member, through which the through hole TH (refer to FIG. 1A) is not defined, and a window member covering the display panel; and FIG. 4B shows the temperature distribution of the display device including the display panel, the heat radiating member 200 (refer to FIG. 1A), and the window member. The temperature distributions shown in FIGS. 4A and 4B are respectively obtained from the display devices having the same structure except for the heat radiating member.

Meanwhile, FIGS. 4A and 4B show temperatures measured at an upper side (outside) of the window members. Temperatures measured at driving circuits respectively built in the display device of the comparison example and the display device DM are indicated by a peak in a right temperature graph. Referring to FIGS. 4A and 4B, areas, in which the temperature is highest, of the display device of the comparison example and the display device DM of the present disclosure may overlap with the area in which the driving circuit 300 (refer to FIG. 1) is positioned.

As shown in FIG. 4A, the temperature of the driving circuit according to the comparison example was measured at about 42.96 degrees. The highest temperature measured in the comparison example was about 39.24 degrees, and a difference in temperature between two areas overlapping each other when viewed in a plan view was measured at about 3.72 degrees.

The temperature of the driving circuit 300 according to the embodiment example was measured at about 43.18 degrees. In this case, as shown in FIG. 4B, the highest temperature measured in the display device DM was about 39.50 degrees, and a difference in temperature between two areas overlapping each other when viewed in a plan view was measured at about 3.68 degrees.

That is, the display device DM according to the present disclosure has a temperature reduction effect relatively smaller than that of the comparison example. However, the temperature reduction difference between the embodiment example and the comparison example is equal to or smaller than about 1 degree.

In the display device DM according to the exemplary embodiment of the present disclosure, the area of the heat radiating layer may be reduced by the through holes TH defined through the heat radiating layer, but influences on the heat discharging characteristics by the reduction of the heat discharging area is practically negligible. On the contrary, as described above, since the through holes TH are defined through the heat radiating member, the adhesive characteristics represented by the release force were greatly improved. Accordingly, the display device DM including the heat radiating member through which the through holes TH are defined may have the improved adhesive characteristics while ensuring the heat discharging characteristics.

Figure 5A:
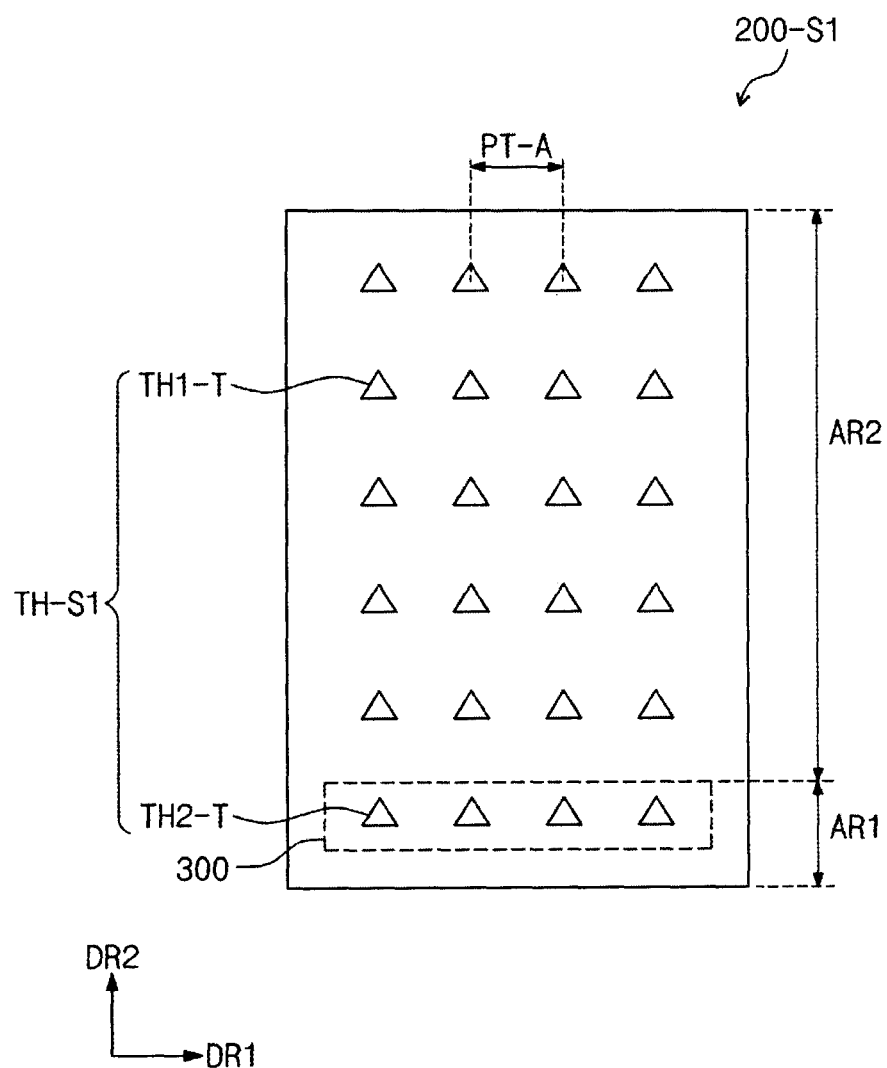
FIG. 5A is a plan view showing a heat radiating member of a display member, according to an exemplary embodiment of the present disclosure.
Figure 5B:
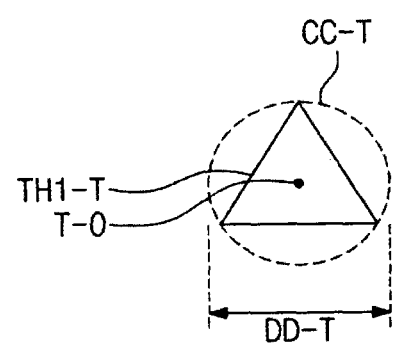
FIG. 5B is a plan view showing a portion of the heat radiating member shown in FIG. 5A.
Figure 5C:
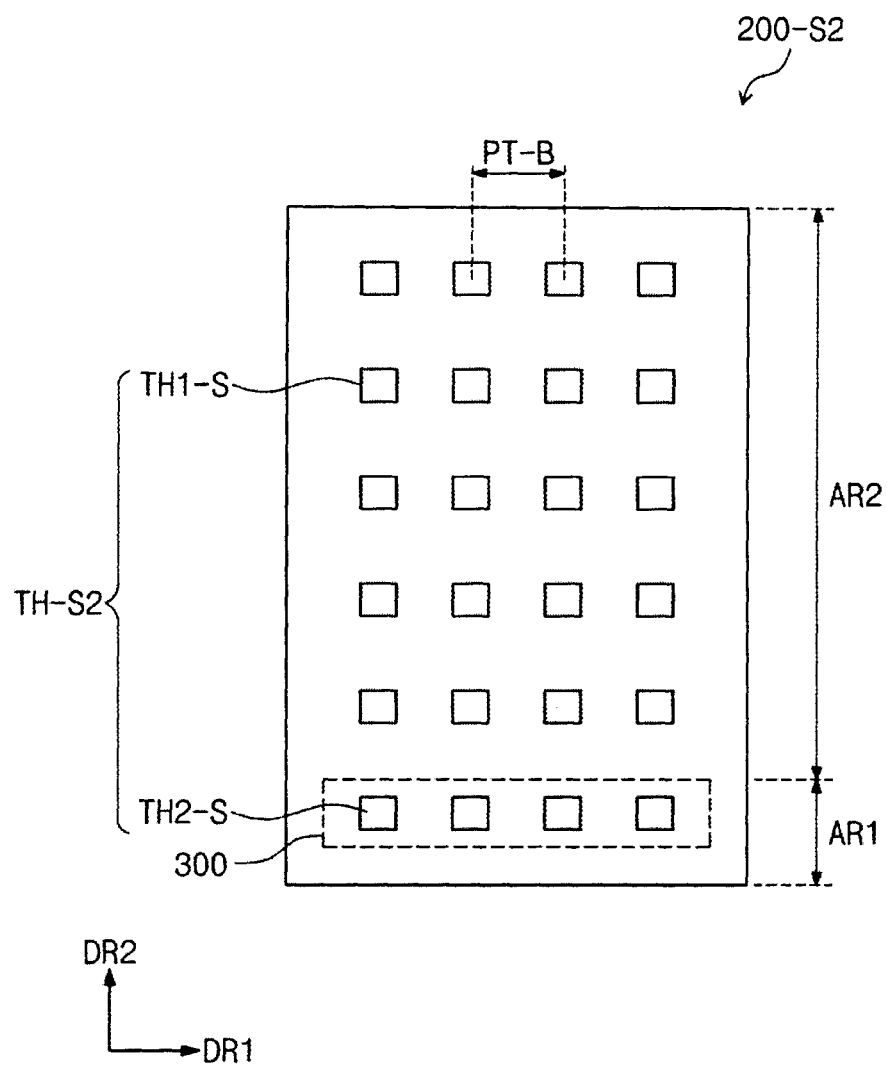
FIG. 5C is a plan view showing a heat radiating member according to another exemplary embodiment of the present disclosure.
Figure 5D:
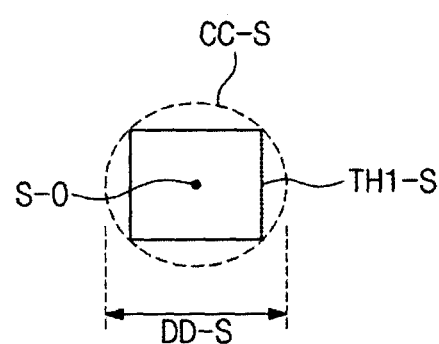
FIG. 5D is a plan view showing a portion of the heat radiating member shown in FIG. 5C.
Figure 6A:
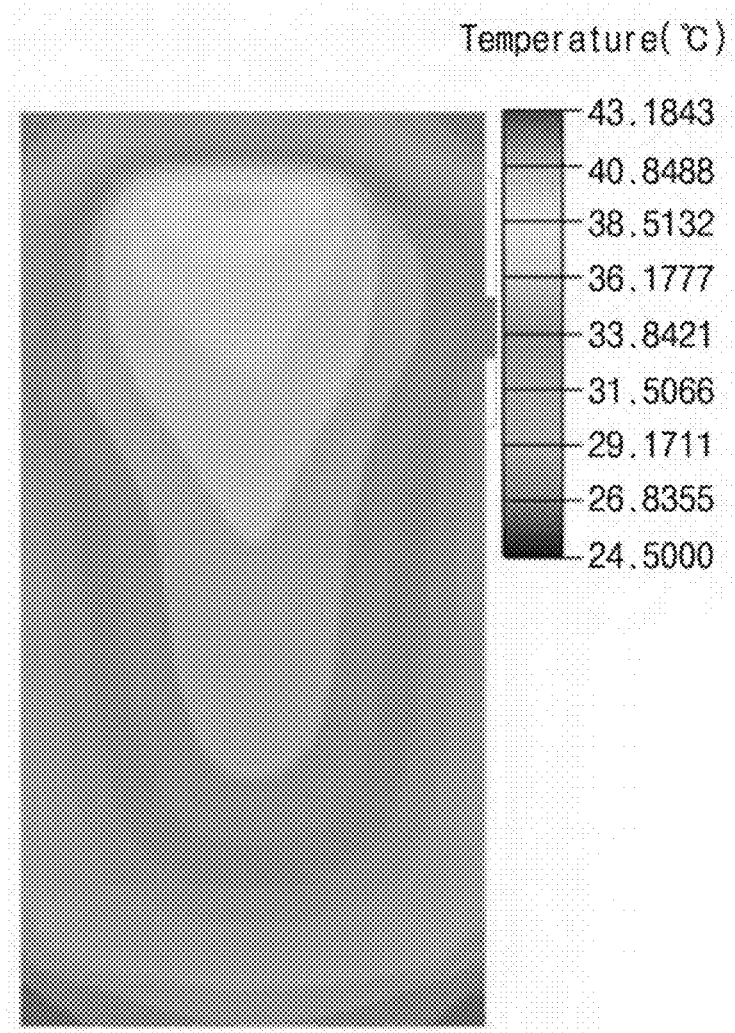
FIGS. 6A to 6C are views showing temperature distributions of display devices according to exemplary embodiments of the present disclosure.
Figure 6B:
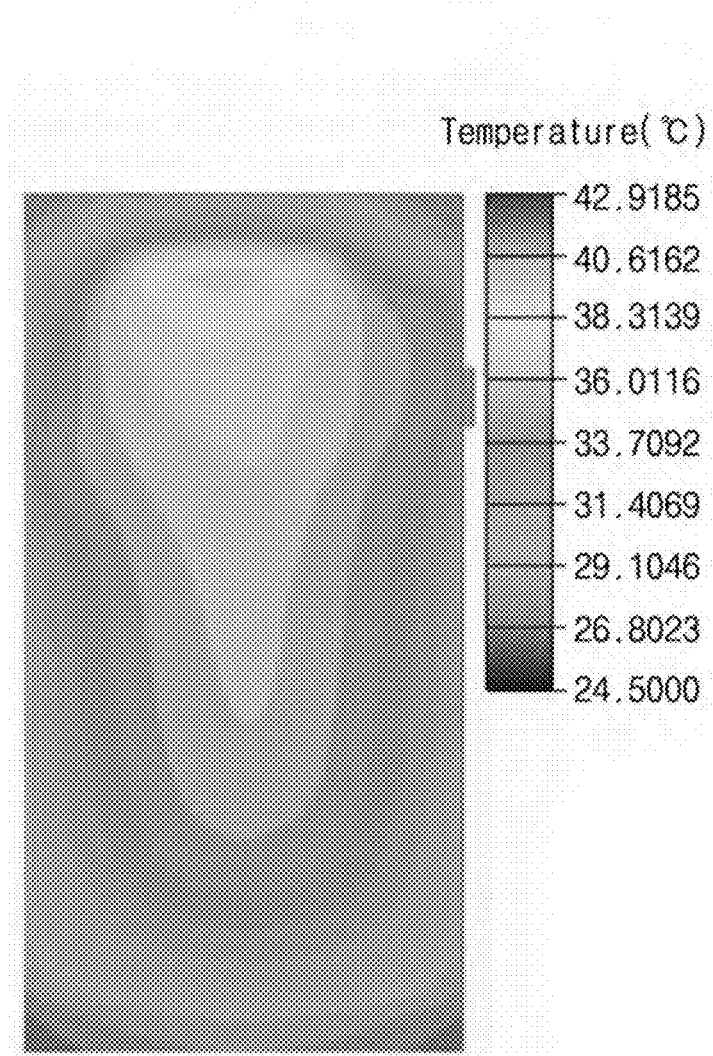
Figure 6C:
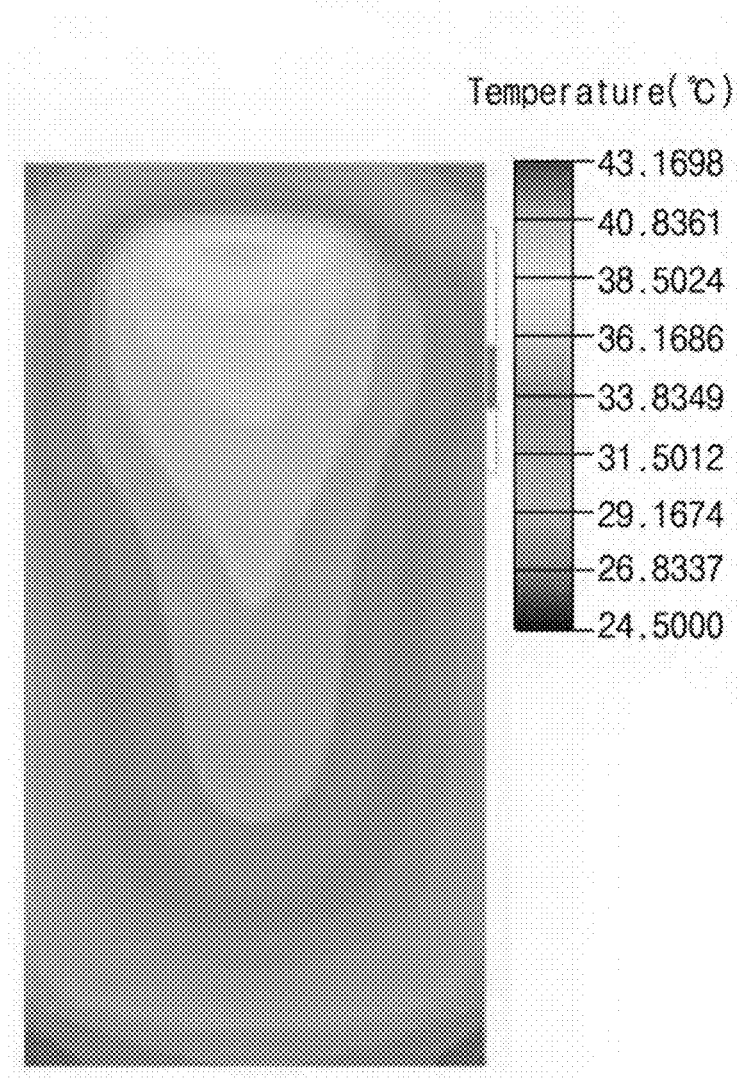

FIG. 5A is a plan view showing a heat radiating member according to another exemplary embodiment of the present disclosure; FIG. 5B is a plan view showing a portion of the heat radiating member shown in FIG. 5A; FIG. 5C is a plan view showing a heat radiating member according to another exemplary embodiment of the present disclosure; and FIG. 5D is a plan view showing a portion of the heat radiating member shown in FIG. 5C. FIGS. 6A to 6C are views showing temperature distributions of display devices according to exemplary embodiments of the present disclosure.

For the convenience of explanation, a heat radiating member 300 is represented by a dashed line in FIGS. 5A and 5C. FIGS. 6A to 6C show temperature distributions in display devices each including a display panel, a heat radiating member, and a window member. FIGS. 6A to 6C respectively show temperature distributions measured at the window member.

In further detail, FIG. 6A shows the temperature distribution of a display device including the heat radiating member 200-C as shown in FIG. 3C; FIG. 6B shows the temperature distribution of a display device including a heat radiating member 200-S1 as shown in FIG. 5A; and FIG. 6C shows the temperature distribution of a display device including a heat radiating member 200-S2 as shown in FIG. 5C. Herein, the heat radiating members 200-S1 and 200-S2 according to the present disclosure will be described in further detail with reference to FIGS. 5A to 5D and 6A to 6C.

In the present exemplary embodiments, a plurality of through holes may have a variety of shapes. For example, through holes TH-S1 each having a triangular shape may be defined through the heat radiating member 200-S1, as shown in FIGS. 5A and 5B.

The through holes TH-S1 may be arranged spaced apart from each other at a pitch (e.g., a predetermined pitch) PT-A in a first direction DR1. In an embodiment, the through holes TH-S1 are spaced apart from each other at the same pitch PT-A in the first direction DR1.

The through holes TH-S1 include a plurality of first through holes TH1-T arranged in a second area AR2 and a plurality of second through holes TH2-T arranged in a first area AR1. In an embodiment, the first through holes TH1-T and the second through holes TH2-T may have the same shape, as a representative example. However, embodiments of the present disclosure are not limited thereto.

The first through hole TH1-T may have the triangular shape having three vertices making contact with a circumscribed circle (e.g., a predetermined circumscribed circle) CC-T. In the present exemplary embodiment, a center T-0 of the circumscribed circle CC-T may correspond to a center of the first through hole TH1-T. Accordingly, the pitch PT-A corresponds to a distance in the first direction DR1 between the center T-0 of the circumscribed circle CC-T and a center of a circumscribed circle around another first through hole TH1-T adjacent to the circumscribed circle CC-T. In an embodiment, a diameter DD-T of the first through hole TH1-T may correspond to a diameter of the circumscribed circle CC-T.

In another embodiment, through holes TH-S2 each having a quadrangular shape may be defined through the heat radiating member 200-S2, as shown in FIGS. 5C and 5D. The through holes TH-S2 may be arranged spaced apart from each other at a pitch (e.g., a predetermined pitch) PT-B in the first direction DR1. In an embodiment, the through holes TH-S2 are spaced apart from each other at the same pitch PT-B in the first direction DR1.

The through holes TH-S2 include a plurality of first through holes TH1-S arranged in a second area AR2 and a plurality of second through holes TH2-S arranged in a first area AR1. In an embodiment, the first through holes TH1-S and the second through holes TH2-S may have the same shape as a representative example. However, embodiments of the present disclosure are not limited thereto.

The first through hole TH1-S may have the quadrangular shape having four vertices making contact with a circumscribed circle (e.g., a predetermined circumscribed circle) CC-S. In the present exemplary embodiment, a center S-0 of the circumscribed circle CC-S may correspond to a center of the first through hole TH1-S. Accordingly, the pitch PT-B corresponds to a distance in the first direction DR1 between the center S-0 of the circumscribed circle CC-S and a center of a circumscribed circle around another first through hole TH1-S adjacent to the circumscribed circle CC-S. In an embodiment, a diameter DD-S of the first through hole TH1-S may correspond to the diameter of the circumscribed circle CC-S.

The shape of the through holes may be associated with cross-sectional areas of the through holes when viewed in a plan view. FIGS. 6A to 6C show the temperature distributions of display devices respectively having circular, triangular, and quadrangular shapes with respect to the same circumscribed circle.

FIGS. 6A to 6C show the temperature measured at a driving circuit built in the display device as a peak temperature in a right temperature graph. In FIGS. 6A to 6C, an area having the highest temperature substantially overlaps an area in which the driving circuit is positioned.

The temperature of the driving circuit of the display device shown in FIG. 6A was measured at about 43.18 degrees. In this case, as shown in FIG. 6A, the highest temperature measured at the window member of the display device in which the circular-shaped through holes are defined was about 39.50.

The temperature of the driving circuit of the display device shown in FIG. 6B was measured at about 42.91 degrees. In this case, as shown in FIG. 6B, the highest temperature measured at the window member of the display device in which the triangular-shaped through holes are defined was about 39.30.

The temperature of the driving circuit of the display device shown in FIG. 6C was measured at about 43.17 degrees. In this case, as shown in FIG. 6C, the highest temperature measured at the window member of the display device in which the quadrangular-shaped through holes are defined was about 39.49.

When the circumscribed circle is constant, the area of the through hole increases in an order of the triangular shape, the quadrangular shape, and the circular shape. On the contrary, when the circumscribed circle is constant, the heat discharging area decreases in an order of the triangular shape, the quadrangular shape, and the circular shape of the through hole.

That is, the heat radiating member 200-C having the circular-shaped through hole has the smallest heat discharging area, and the heat radiating member 200-S1 having the triangular-shaped through hole has the largest heat discharging area. Accordingly, the peak temperature measured at the display device shown in FIG. 6B is the lowest temperature.

However, a peak temperature difference is equal to or smaller than about 1 degree, i.e., about 0.2 degrees. Accordingly, influences on the heat discharging characteristics by the cross-sectional area difference of the through hole may be smaller than influences on the adhesive characteristics by the cross-sectional area difference of the through hole. Therefore, the shape and area of the through holes of the display device according to the present disclosure may be designed in various ways, and thus the adhesive characteristics may be easily controlled while ensuring the heat discharging characteristics.

Figure 7A:
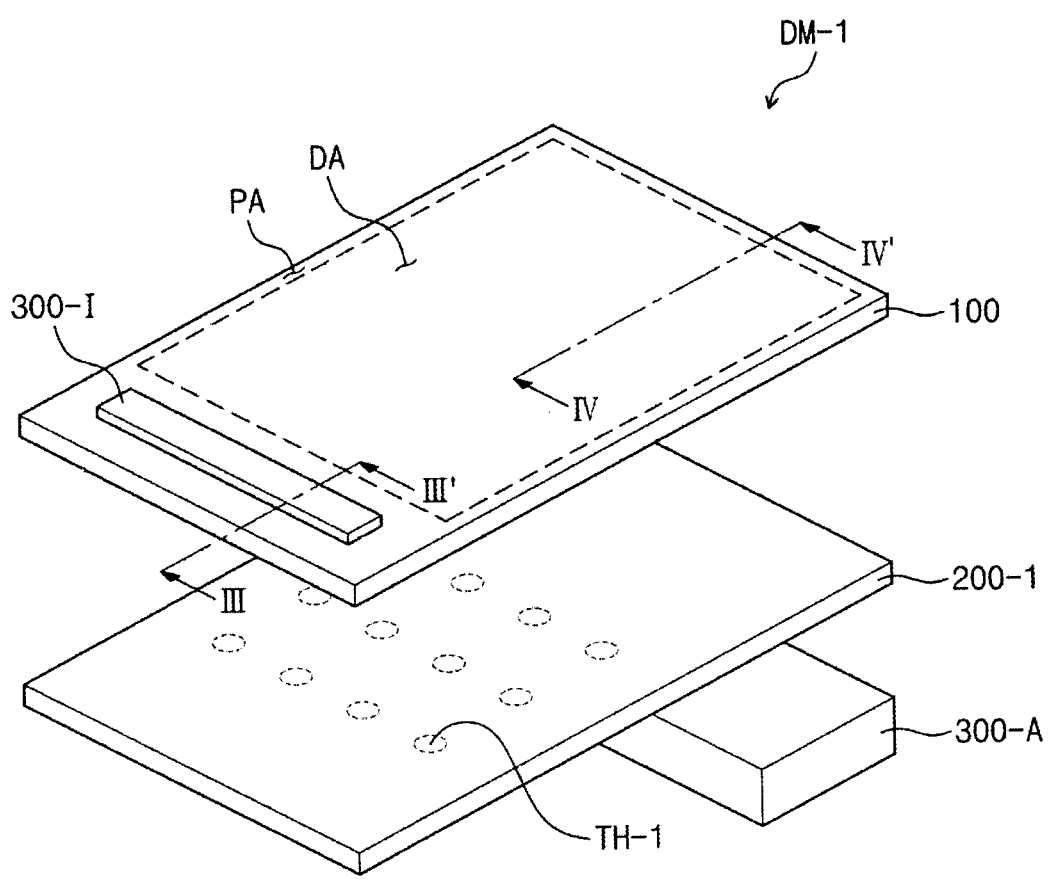
FIG. 7A is an exploded perspective view showing a display device according to another exemplary embodiment of the present disclosure.
Figure 7B:
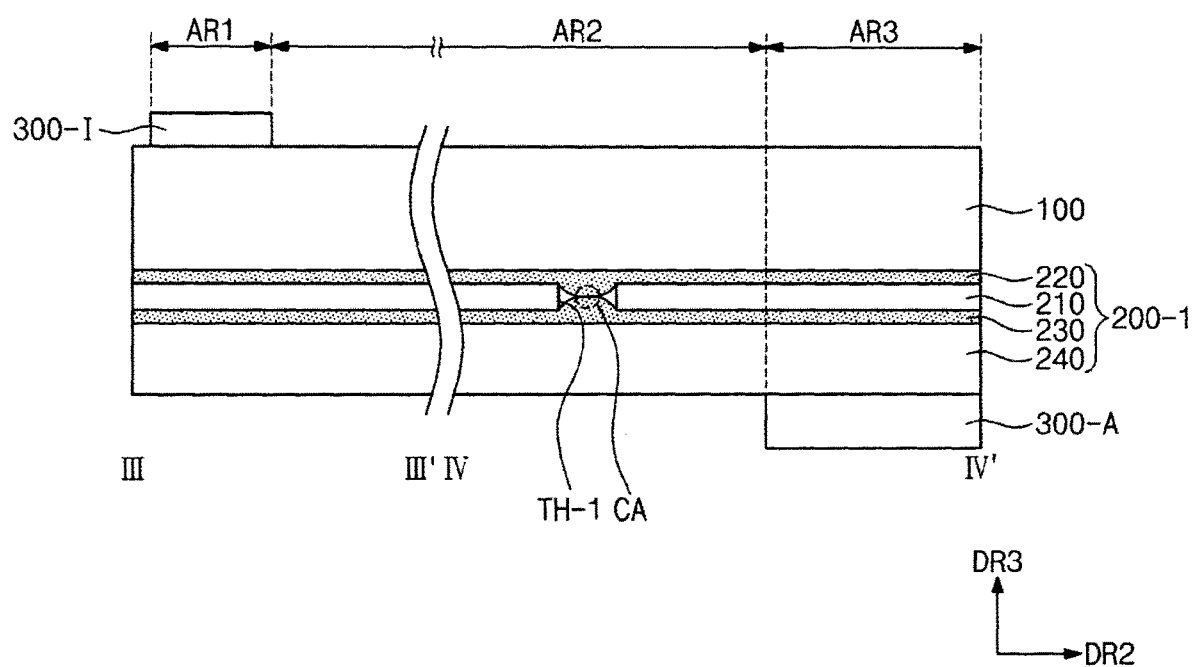
FIG. 7B is a cross-sectional view showing a portion of the display device shown in FIG. 7A.
Figure 8A:
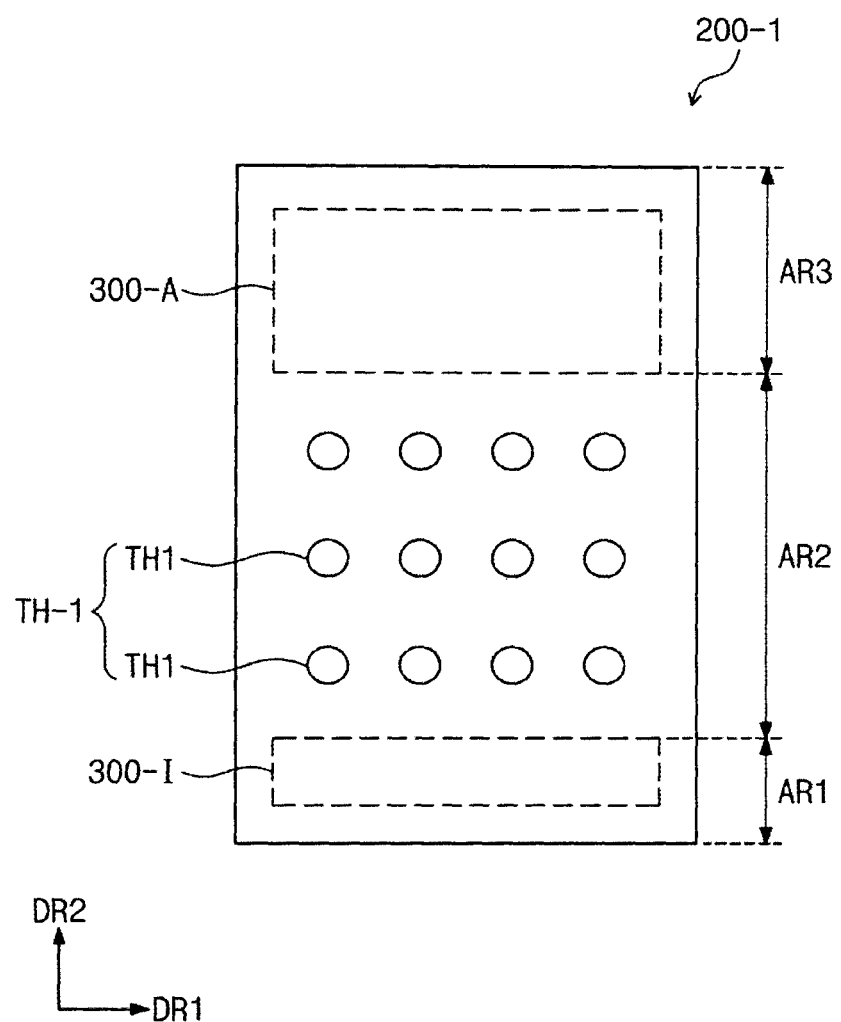
FIGS. 8A to 8C are plan views showing heat radiating members of a display device, according to some exemplary embodiments of the present disclosure.
Figure 8B:
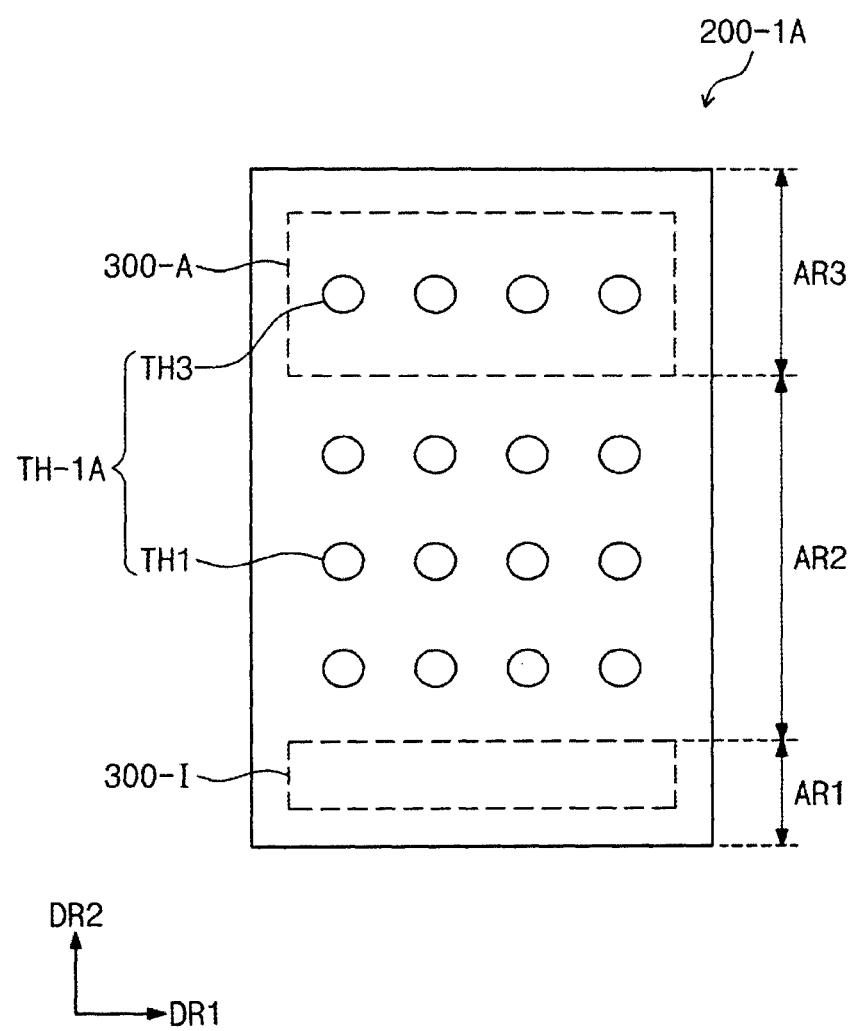
Figure 8C:
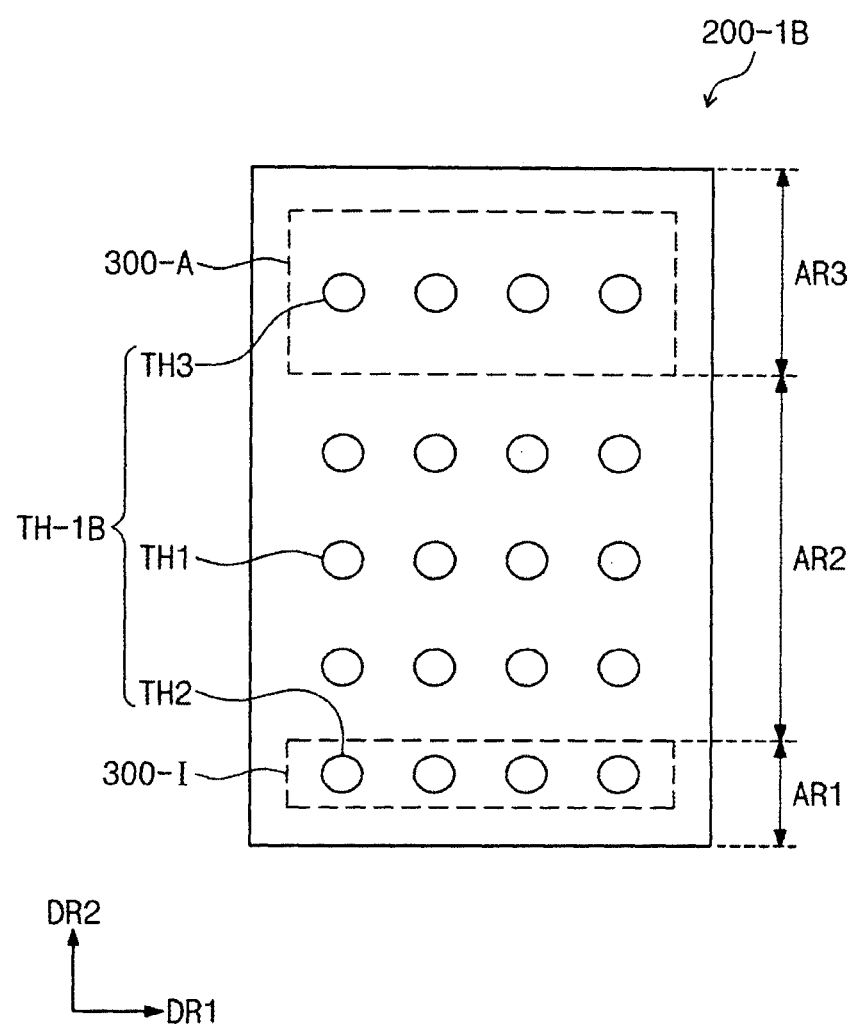

FIG. 7A is an exploded perspective view showing a display device according to another exemplary embodiment of the present disclosure. FIG. 7B is a cross-sectional view showing a portion of the display device shown in FIG. 7A. FIGS. 8A to 8C are plan views showing heat radiating members according to exemplary embodiments of the present disclosure.

For the convenience of explanation, FIG. 7B shows the cross-sectional view of the display device in an assembled state, that is, cross-sectional views taken along lines III-III' and IV-IV' shown in FIG. 7A. In FIGS. 8A to 8C, areas overlapping an inner heat generating member 300-I and an additional heat generating member 300-A are represented by dashed lines.

Herein, a display device DM-1 according to an exemplary embodiment of the present disclosure will be described in further detail with reference to FIGS. 7A to 8C. In FIGS. 7A to 8C, the same reference numerals denote the same elements in FIGS. 1A to 6C, and thus further detailed descriptions of the same elements may be omitted.

Referring to FIGS. 7A and 7B, the display device DM-1 may include a display panel 100, a heat radiating member 200-1, the inner heat generating member 300-I, and the additional heat generating member 300-A. The inner heat generating member 300-I may be a driving circuit mounted on the display panel 100 and may correspond to the heat generating member 300 shown in FIG. 1A. Accordingly, further details of the inner heat generating member 300-I will not be repeated.

The additional heat generating member 300-A is disposed outside the display panel 100. The additional heat generating member 300-A may be a circuit board including driving devices, e.g., a processor chip, or a power supply member supplying a power to the display device DM-1. However, according to another embodiment, the additional heat generating member 300-A may be provided separate from the display panel and may include various members generating the heat while operating.

The additional heat generating member 300-A may be disposed under the heat radiating member 200-1. Accordingly, the additional heat generating member 300-A may be disposed spaced apart from the display panel 100 in the third direction DR3 such that the heat radiating member 200-1 is disposed between the additional generating member 300-A and the display panel 100.

The heat radiating member 200-1 is disposed between the display panel 100 and the additional heat generating member 300-A. Referring to FIGS. 7B and 8A, the heat radiating member 200-1 may be divided into a plurality of areas when viewed in a plan view. The areas may include a first area AR1 overlapping the inner heat generating member 300-I, a second area AR2 adjacent to the first area AR1, and a third area AR3 overlapping the additional heat generating member 300-A.

The heat radiating member 200-1 discharges the heat generated by the heat generating member disposed adjacent thereto. Accordingly, the heat radiating member 200-1 may discharge the heat generated from the display panel 100 and the inner heat generating member 300-I in the first area AR1, discharge the heat generated from the display panel 100 in the second area AR2, and discharge the heat generated from the display panel 100 and the additional heat generating member 300-A in the third area AR3.

Through holes TH-1 may be arranged in at least one area of the first, second, and third areas AR1, AR2, and AR3. For instance, as shown in FIG. 8A, the through holes TH-1 of the heat radiating member 200-1 may include first through holes TH1 arranged in the second area AR2. The second area AR2 may be an area generating a relatively low heat. Thus, the display device DM-1 may effectively secure the heat discharging area in the area generating a relatively high heat and secure the adhesive area in the area generating the relatively low heat.

In another embodiment, as shown in FIG. 8B, through holes TH-1A of a heat radiating member 200-1A may include first through holes TH1 defined in the second area AR2 and third through holes TH3 defined in the third area AR3.

In another embodiment, as shown in FIG. 8C, through holes TH-1B of a heat radiating member 200-1B may include first through holes TH1 defined in the second area AR2, third through holes TH3 defined in the third area AR3, and second through holes TH2 defined in the first area AR1.

The display device DM-1 according to the present exemplary embodiment may include any of the heat radiating members through which the through holes are defined in various different arrangements. The through holes may be arranged and distributed in various ways in accordance with the heat generated by the heat generating member adjacent to the through hole and are not limited to a specific embodiment.

Referring to FIGS. 7A and 7B again, a first adhesive layer 220 and a second adhesive layer 230 may be connected to each other through the through holes TH-1. A contact area CA, in which the first and second adhesive layers 220 and 230 make contact with each other, may be defined in the first and second adhesive layers 220 and 230. The contact area CA is defined in the through holes TH-1. Further descriptions about the contact area CA will not be repeated.

The display device DM-1 according to the present exemplary embodiment includes the heat radiating member 200-1, and thus the heat radiating member 200-1 may be stably coupled to the display panel 100 without deteriorating the adhesive characteristics even though the heat generating members are disposed adjacent to opposite surfaces of the heat radiating member 200-1. In addition, although the heat generating members are disposed adjacent to the heat radiating member 200-1, the heat radiating member 200-1 may concurrently or simultaneously secure the adhesive characteristics and the heat discharging characteristics by appropriately designing the through holes.

Figure 9A:
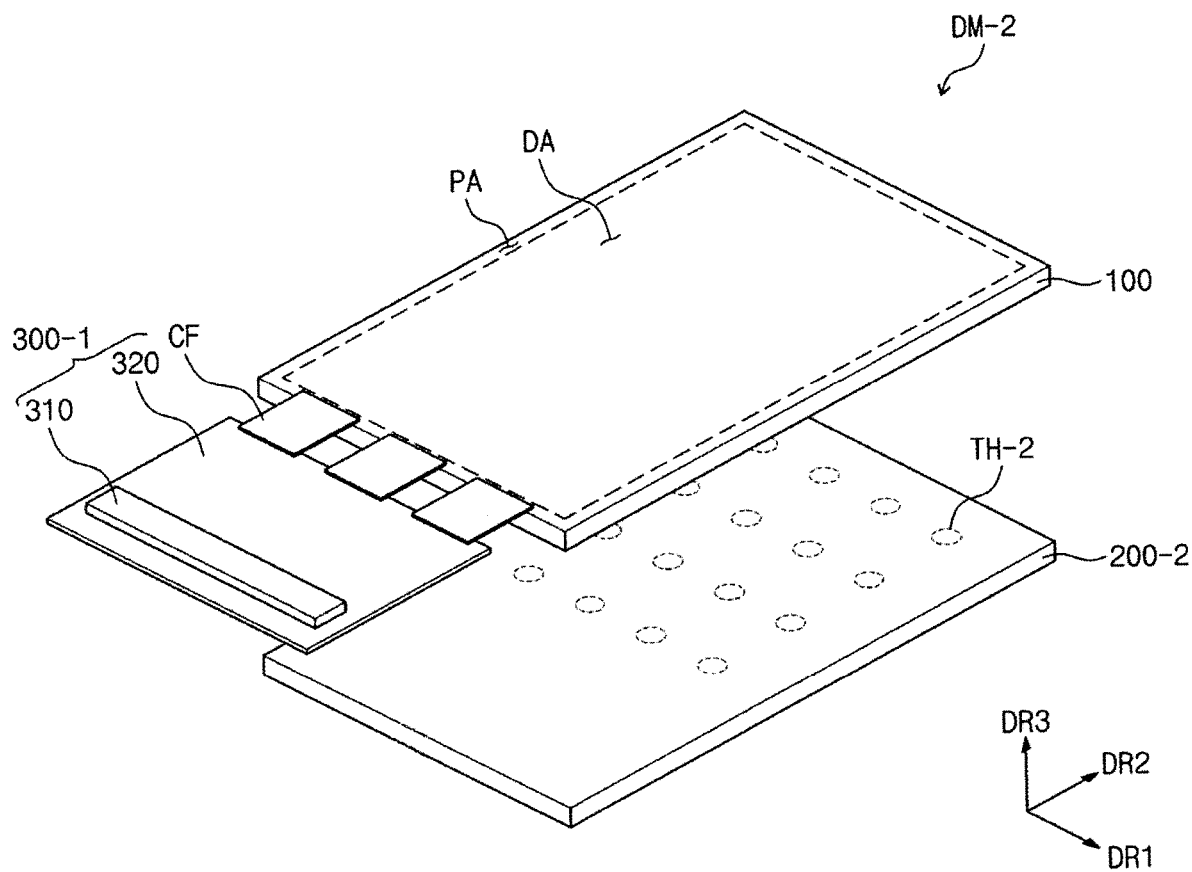
FIG. 9A is an exploded perspective view showing a display device according to another exemplary embodiment of the present disclosure.
Figure 9B:
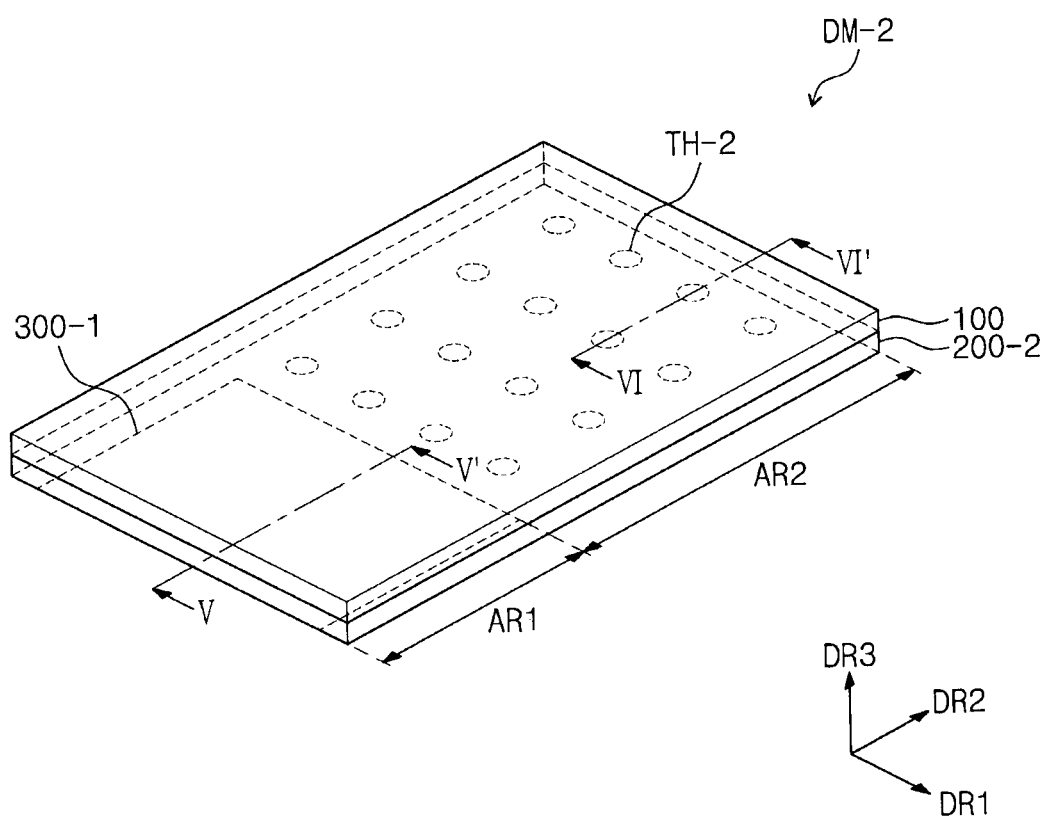
FIG. 9B is a perspective view showing the display device of FIG. 9A in an assembled state.
Figure 9C:
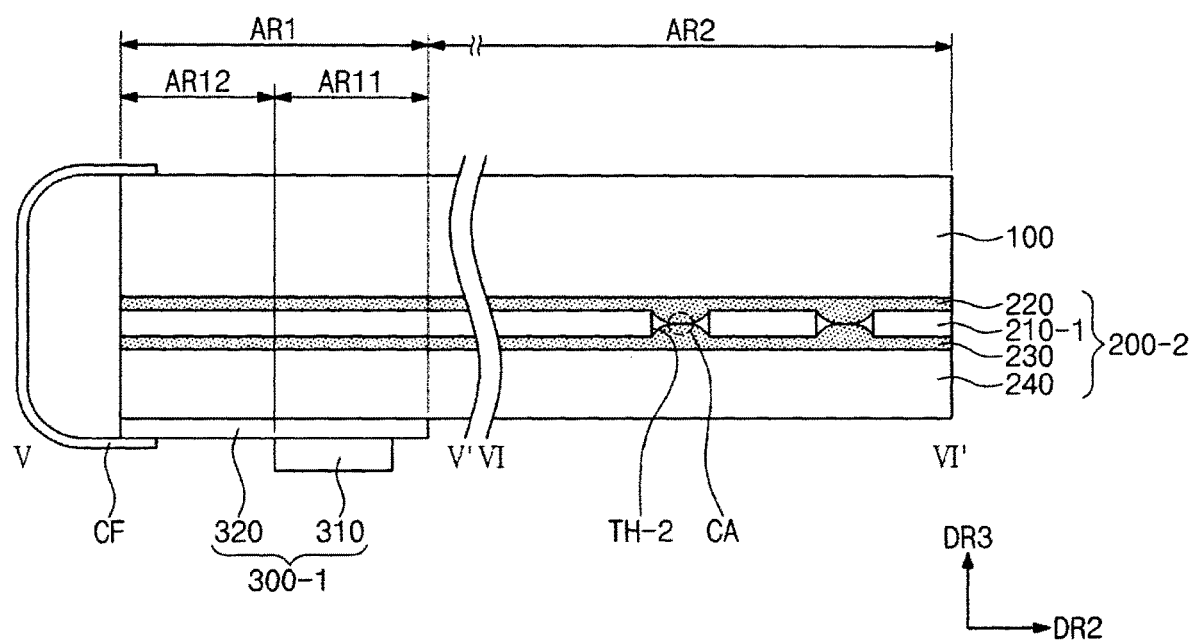
FIG. 9C is a cross-sectional view showing a portion of the display device shown in FIG. 9B.
Figure 10A:
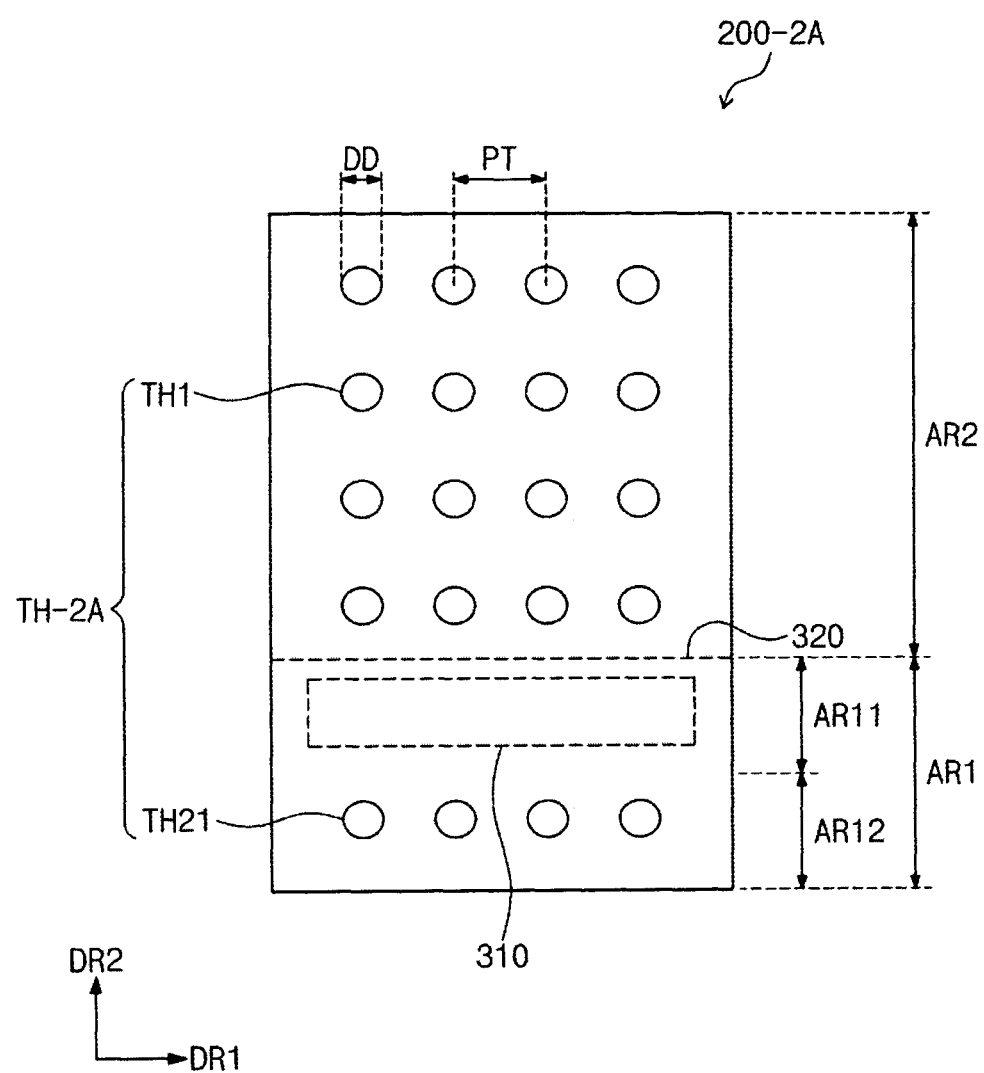
FIGS. 10A to 10C are plan views showing heat radiating members of a display device, according to some exemplary embodiments of the present disclosure.
Figure 10B:
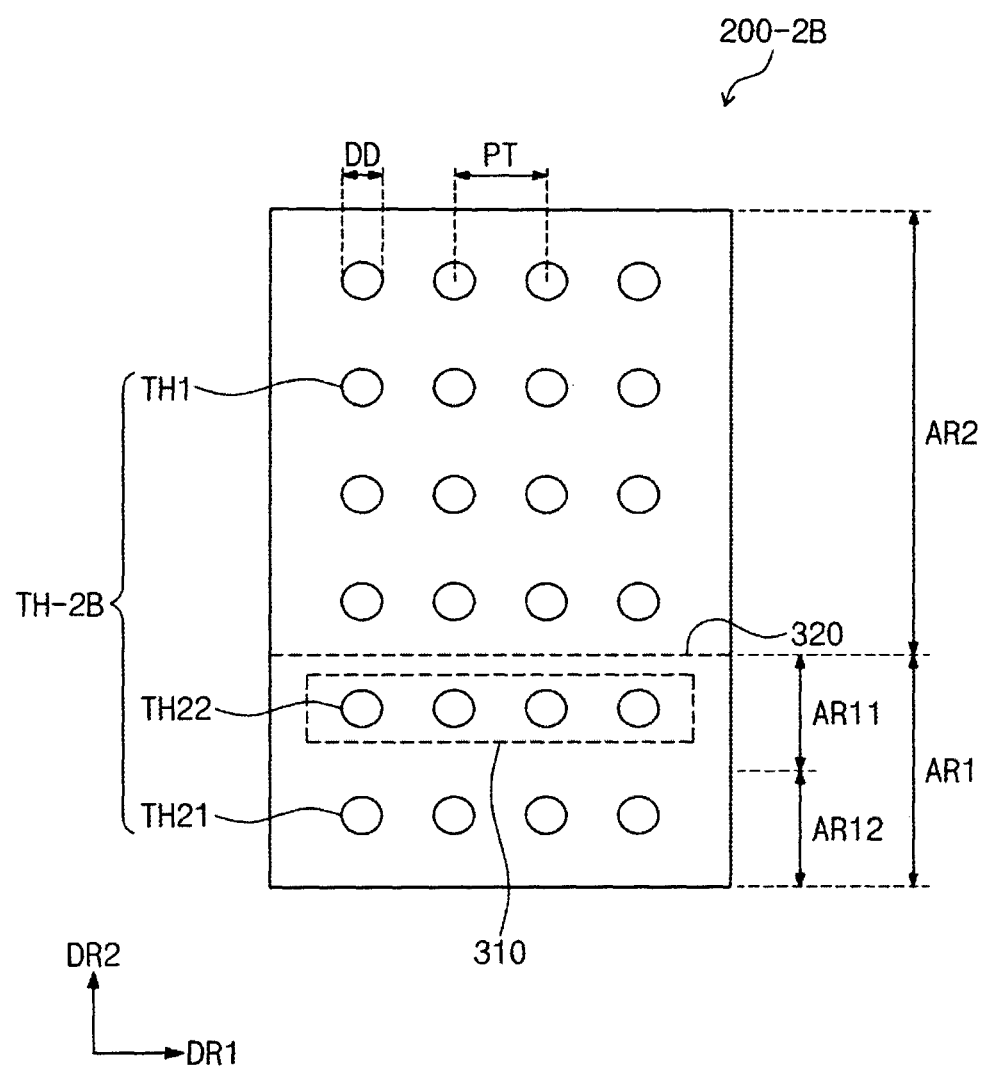
Figure 10C:
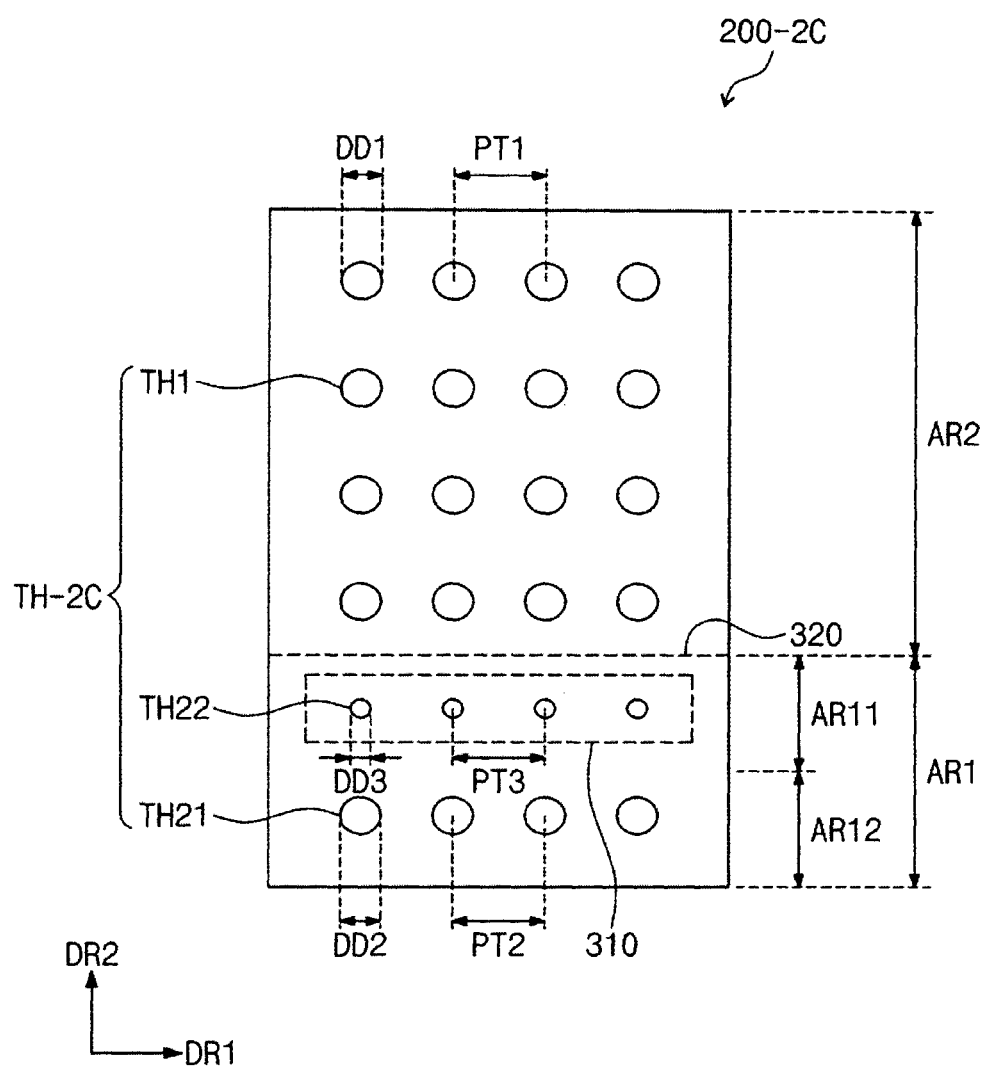

FIG. 9A is an exploded perspective view showing a display device DM-2 according to another exemplary embodiment of the present disclosure. FIG. 9B is a combined perspective view showing the display device DM-2 shown in FIG. 9A. FIG. 9C is a cross-sectional view showing a portion of the display device DM-2 shown in FIG. 9B. FIGS. 10A to 10C are plan views showing heat radiating members according to exemplary embodiments of the present disclosure.

For the convenience of explanation, FIG. 9B shows some components as the perspective view, and FIG. 9C shows cross-sectional views respectively taken along lines V-V and VI-VI' shown in FIG. 9B. Herein, the display device DM-2 will be described in further detail with reference to FIGS. 9A to 9C. In FIGS. 9A to 9C, the same reference numerals denote the same elements in FIGS. 1A to 8C, and thus further detailed descriptions of the same elements will not be repeated.

The display device DM-2 may include a display panel 100, a heat radiating member 200-2, and a heat generating member 300-1. In the present exemplary embodiment, the heat radiating member 300-1 is referred to as a circuit board 300-1 connected to the display panel 100.

The circuit board 300-1 may include at least one driving device that outputs an electrical signal to the display panel 100 or processes the electrical signal provided from the display panel 100. The driving device may generate a heat (e.g., a predetermined heat) while operating. Accordingly, the circuit board 300-1 may be one of heat generating members generating the heat while operating.

The circuit board 300-1 may be physically and electrically connected to the display panel 100 via at least one flexible film CF. The flexible film CF may include a flexible material. The flexible film CF may be bent, and thus the circuit board 300-1 may be positioned at any of various positions. In the present exemplary embodiment, the flexible film CF may be bent to allow the circuit board CF to be disposed under the display panel 100 and the heat radiating member 200-2.

Although not shown in the figures, the flexible film CF may be removed from the display device DM-2. In this case, the circuit board 300-1 may be disposed under the display panel 100 after being directly connected to the display panel 100. The circuit board 300-1 according to the present exemplary embodiment may be coupled to the display panel 100 in various ways.

The circuit board 300-1 may include a driving device 310 and a substrate 320. The driving device 310 outputs the electrical signal to drive the display panel 100. The driving device 310 may be provided in a single or plural number and mounted on the substrate 320. The driving device 310 may generate a heat (e.g., a predetermined heat) while generating and processing the electrical signal.

The substrate 320 may include conductive lines (not shown). The conductive lines are connected to the driving device 310 to transmit the electrical signal output from the driving device 310 or the electrical signal provided from the display panel 100.

In the present exemplary embodiment, the heat radiating member 200-2 may include a first area AR1 overlapping the circuit board 300-1 and a second area AR2 disposed adjacent to the first area AR1 when viewed in a plan view. The first area AR1 overlapping the circuit board 300-1 may be relatively more largely influenced by the heat generated from the circuit board 300-1 than the second area AR2.

The first area AR1 may include a first sub-area AR11 overlapping the driving device 310 and a second sub-area AR12 disposed adjacent to the first sub-area AR11. The first sub-area AR11 may be relatively more largely influenced by the heat generated from the driving device 310 than the second sub-area AR12.

Through holes TH-2 may have any of various shapes and may be arranged in various ways. For the convenience of explanation, FIGS. 10A to 10C show the driving device 310 and the circuit board 320 as dashed lines.

In an embodiment, referring to FIG. 10A, a plurality of through holes TH-2A of a heat radiating member 200-2A may include first through holes TH1 arranged in the second area AR2 and second through holes TH21 arranged in the second sub-area AR12. The through holes TH-2A are mainly arranged in the area generating the relatively low heat, and thus the heat discharging area of the heat radiating member 200-2A may be secured, and the adhesive area of the heat radiating member 200-2A may be increased.

In another embodiment, referring to FIG. 10B, a plurality of through holes TH-2B of a heat radiating member 200-2B may include the first through holes TH1 arranged in the second area AR2, the second through holes TH21 arranged in the second sub-area AR12, and third through holes TH22 arranged in the first sub-area AR11.

As described above, the deterioration degree of the heat discharging characteristics by the through holes may be relatively smaller than the improved degree of the adhesive characteristics by the through holes. The heat radiating member 200-2B according to the present exemplary embodiment includes the third through holes TH22 defined through the first sub-area AR11 generating the relatively high heat, and thus the adhesive characteristics of the heat radiating member 200-2B may be improved.

In another embodiment, referring to FIG. 10C, a plurality of through holes TH-2C of a heat radiating member 200-2C may have various sizes and may be arranged in various ways. First through holes TH1 are arranged at a first pitch PT1 in the first direction DR1, and each first through hole TH1 may have a circular shape having a first diameter DD1.

Second through holes TH21 are arranged at a second pitch PT2 in the first direction DR1, and each second through hole TH21 may have a circular shape having a second diameter DD2. Third through holes TH22 are arranged at a third pitch PT3 in the first direction DR1, and each third through hole TH22 may have a circular shape having a third diameter DD3.

In an embodiment, the first, second, and third diameters DD1, DD2, and DD3 may have various sizes and may be designed independently from each other. In the present exemplary embodiment, the third diameter DD3 may be smaller than the first and second diameters DD1 and DD2. That is, the third through holes TH22 may have a cross-sectional area smaller than that of the first and second through holes TH1 and TH21.

Accordingly, the heat radiating member 200-2C may have a relatively small adhesive area in the first sub-area AR11. The heat radiating member 200-2C according to the present exemplary embodiment may improve the heat discharging characteristics in the area generating the relatively high heat and reduce the adhesive characteristics, such as to a minimum level, and thus the heat discharging characteristics and the adhesive characteristics may be easily independently designed from each other.

In an embodiment, the first pitch PT1 in the first direction DR1 between the first through holes TH1, the second pitch PT2 in the first direction DR1 between the second through holes TH21, and the third pitch PT3 in the first direction DR1 between the third through holes TH22 may be independently designed from each other. In the present exemplary embodiment, the first, second, and third pitches PT1, PT2, and PT3 may be the same as one another, but, in another embodiment, the first, second, and third pitches PT1, PT2, and PT3 may be partially the same as each other or different from one another.

Figure 11A:
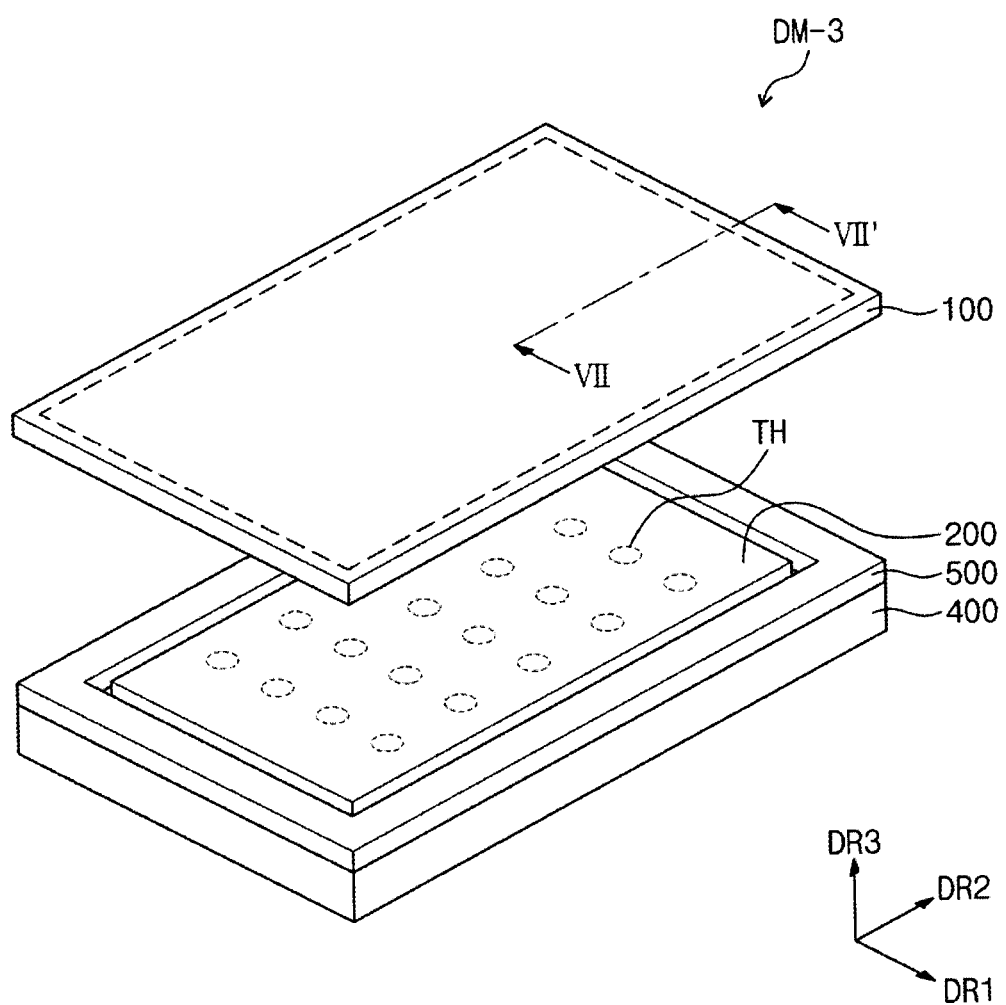
FIG. 11A is an exploded perspective view showing a display device according to another exemplary embodiment of the present disclosure.
Figure 11B:
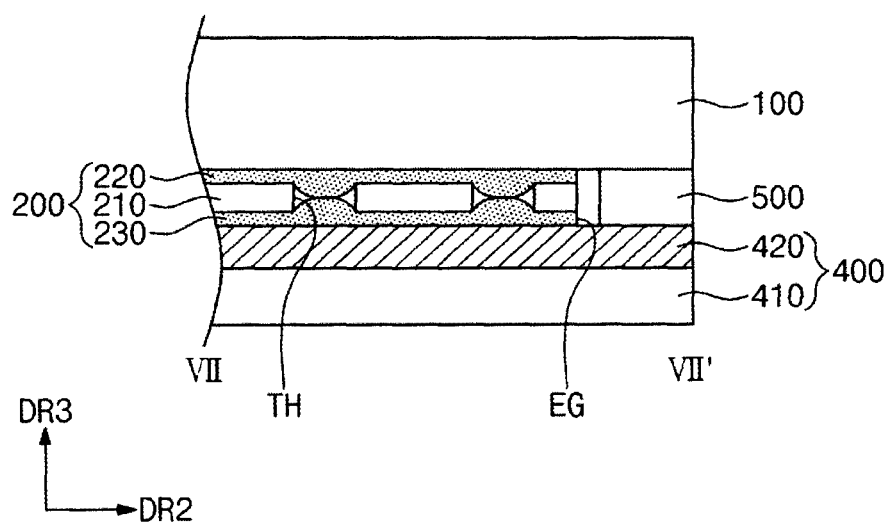
FIG. 11B is a cross-sectional view showing a portion of the display device shown in FIG. 11A.

FIG. 11A is an exploded perspective view showing a display device DM-3 according to another exemplary embodiment of the present disclosure. FIG. 11B is a cross-sectional view showing a portion of the display device DM-3 shown in FIG. 11A. FIG. 11B shows the cross-sectional view taken along a line VII-VII' shown in FIG. 11A. Herein, the display device DM-3 will be described in further detail with reference to FIGS. 11A and 11B. In FIGS. 11A and 11B, the same reference numerals denote the same elements in FIGS. 1A to 10C, and thus further descriptions of the same elements may not be repeated.

Referring to FIG. 11A, the display device DM-3 includes a display panel 100, a heat radiating member 200, a protective member 400, and a frame member 500. Although not shown in figures, the display device DM-3 may further include a driving circuit as a heat generating member.

The heat radiating member 200 may have an area equal to or smaller than an area of the display panel 100 when viewed in a plan view. Accordingly, an outer line EG of the heat radiating member 200 may overlap the display panel 100.

The protective member 400 may be disposed under the heat radiating member 200. The protective member 400 may include a protective substrate 410 and an adhesive member 420.

The protective substrate 410 may be, but is not limited to, an insulating substrate. The protective substrate 410 may protect a lower portion of the display panel 100 from external impacts.

The adhesive member 420 fixes the protective substrate 410 to the lower portion of the display panel 100. The adhesive member 420 may have a thickness greater than that of a second adhesive layer. In the present exemplary embodiment, the adhesive member 420 may directly make contact with the second adhesive layer 230.

In this case, the display panel 100 and the heat radiating member 200 may have improved adhesive force in an area in which the through holes TH overlap the display panel 100 and the heat radiating member 200 by the coupling of the first adhesive layer 220, the second adhesive layer 230, and the adhesive member 420. Accordingly, the heat radiating member 200 and the protective member 400 may be stably coupled to the display panel 100.

The frame member 500 is disposed between the display panel 100 and the protective member 400. The frame member 500 has a shape surrounding the heat radiating member 200 when viewed in a plan view.

The outer line EG of the heat radiating member 200 is covered by the frame member 500, and thus the outer line EG is not exposed to the outside of the display device DM-3. Accordingly, the first adhesive layer 220 and the second adhesive layer 230 may be prevented or substantially prevented from being exposed to the outside, and thus the adhesive force of the first and second adhesive layers 220 and 230 may be prevented or substantially prevented from being deteriorated. In addition, the heat radiating layer 210 may be prevented or substantially prevented from being separated from the outer line EG of the heat radiating member 200, and the first adhesive layer 220 may be prevented or substantially prevented from being separated from the display panel 100.

In addition, the frame member 500 is disposed spaced apart from the outer line EG of the heat radiating member 200 by a distance (e.g., a predetermined distance) when viewed in a cross section. Accordingly, external impacts applied to an edge of the display device DM-3 may be prevented or substantially prevented from being transmitted to the heat radiating member 200. Thus, the display device DM-3 further including the frame member 500 may have improved reliability.

Figure 12A:
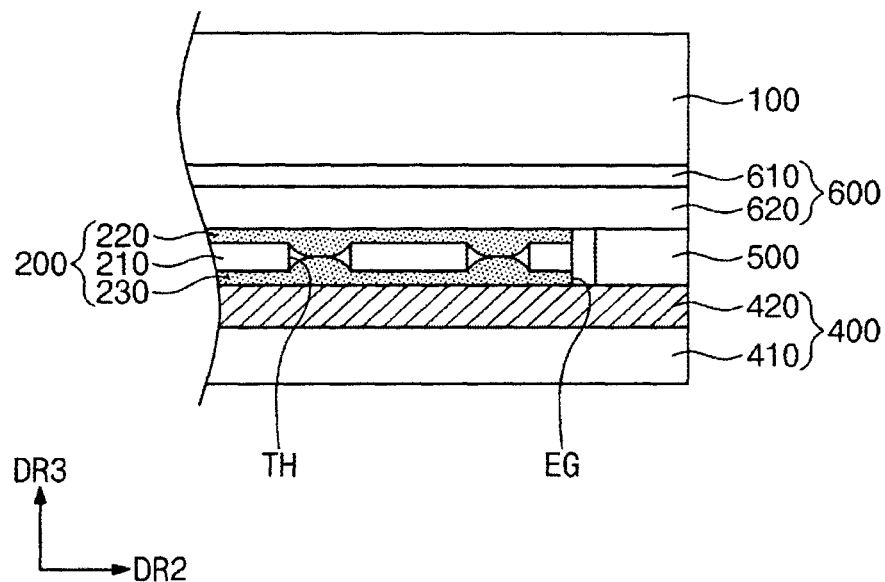
FIG. 12A is a cross-sectional view showing a portion of a display device according to another exemplary embodiment of the present disclosure.
Figure 12B:
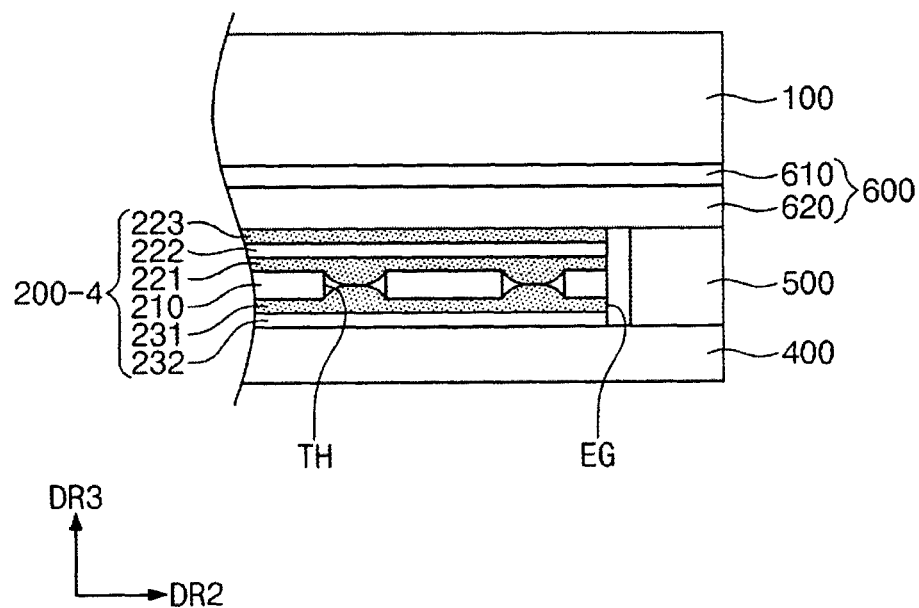
FIG. 12B is a cross-sectional view showing a portion of a display device according to another exemplary embodiment of the present disclosure.
Figure 12C:
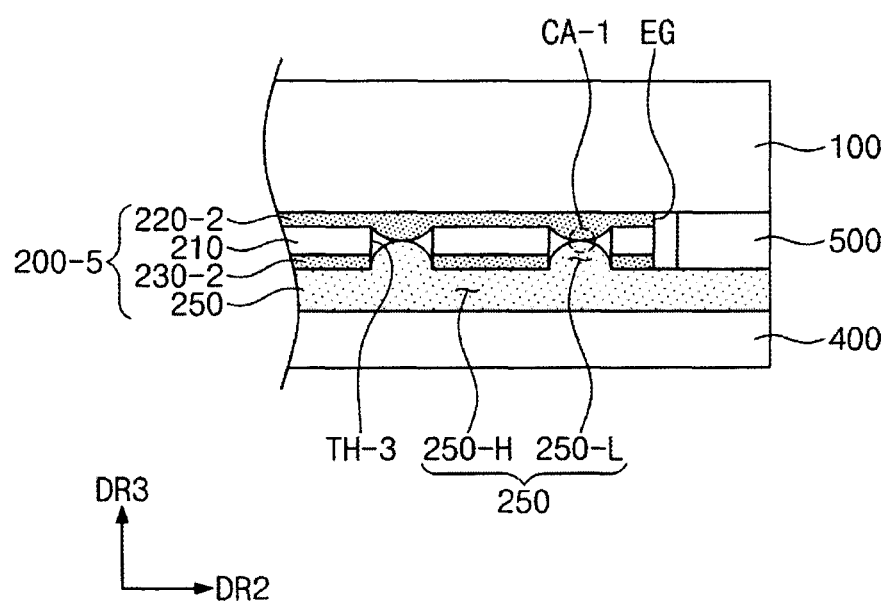
FIG. 12C is a cross-sectional view showing a portion of a display device according to another exemplary embodiment of the present disclosure.

FIG. 12A is a cross-sectional view showing a portion of a display device according to an exemplary embodiment of the present disclosure. FIG. 12B is a cross-sectional view showing a portion of a display device according to another exemplary embodiment of the present disclosure. FIG. 12C is a cross-sectional view showing a portion of a display device according to another exemplary embodiment of the present disclosure. For the convenience of explanation, FIGS. 12A to 12C show a portion of the display device in an area corresponding to the area shown in FIG. 11B. Herein, the display device according to the present exemplary embodiments will be described in further detail with reference to FIGS. 12A to 12C.

Referring to FIG. 12A, the display device may further include an intermediate member 600. The intermediate member 600 may have a stacking structure of a first member 610 and a second member 620.

In the present exemplary embodiment, the intermediate member 600 may be a shock relief member. For instance, the first member 610 may be a coupling member, and the second member 620 may be an elastic member. The first member 610 may stably fix the second member 620 to the display panel 100. The intermediate member 600 may absorb external impacts applied to the display device to prevent or substantially prevent the external impacts from being transmitted to the display panel 100.

In another embodiment, as shown in FIG. 12B, the display device may further include a heat radiating member 200-4 further including an additional functional layer. The additional functional layer may be disposed on a surface of at least one of a first adhesive layer 221 and a second adhesive layer 231.

In the present exemplary embodiment, the additional functional layer may include an upper functional layer 222 and a lower functional layer 232. A heat radiating layer 210, the first adhesive layer 221, and the second adhesive layer 231 may respectively correspond to the heat radiating layer 210, the first adhesive layer 220, and the second adhesive layer 230 described above.

The additional functional layer may improve or complement characteristics of the display device. For instance, the additional functional layer may be a metal layer. As an example, the metal layer may include copper. In this case, the additional functional layer may be a heat radiating layer to improve the heat discharging characteristics of a heat radiating member 200-4 or an electrostatic discharging layer to prevent or substantially prevent a static electricity from being generated while the display device is operated or assembled.

In another embodiment, the additional functional layer may be an insulating layer. As an example, the insulating layer may include polyimide (PI) or polyethylene terephthalate (PET). In this case, the additional functional layer may serve as a supporter to maintain a shape of the display panel 100 or a reliability enhancement layer to improve impact strength of the display device.

In the present exemplary embodiment, the upper functional layer 222 and the lower functional layer 232 may be independent from each other. In further detail, the upper functional layer 222 and the lower functional layer 232 may be the same functional layer or different functional layers.

For instance, the upper functional layer 222 and the lower functional layer 232 may be metal layers. Accordingly, the heat radiating member 200-4 may have an improved heat discharging function. In an embodiment, the electrostatic discharging layer may be omitted in the display device, and thus a manufacturing process of the display device may be simplified, and a manufacturing cost of the display device may be reduced.

In another embodiment, one layer of the upper functional layer 222 and the lower functional layer 232 may be the metal layer, and the other layer of the upper functional layer 222 and the lower functional layer 232 may be the insulating layer. Accordingly, the display device including the heat radiating member 200-4 may have electrostatic discharging characteristics, improved heat discharging characteristics, and improved reliability.

The upper functional layer 222 is disposed between the first adhesive layer 221 and the display panel 100. The upper functional layer 222 makes contact with one surface of the first adhesive layer 221.

In an embodiment, the heat radiating member 200-4 may further include a third adhesive layer 223. The third adhesive layer 223 makes contact with one surface of the upper functional layer 222. The third adhesive layer 223 couples the upper functional layer 222 and the intermediate member 600. However, according to another embodiment, in a case that the intermediate member 600 is omitted, the third adhesive layer 223 may couple the display panel 100 and the upper functional layer 222.

The lower functional layer 232 makes contact with one surface of the second adhesive layer 231. Although not shown in figures, an additional adhesive layer may be further provided to couple the lower functional layer 232 and the protective member 400. In an embodiment, at least one of the upper function layer 222, the lower functional layer 232, and the third adhesive layer 223 may be omitted.

Referring to FIG. 12C, a display device may include a heat radiating member 200-5 further including a third adhesive layer 250. The heat radiating member 200-5 includes a plurality of through holes TH-3 defined therethrough. In this case, the through holes TH-3 may penetrate through a second adhesive layer 230-2 and a heat radiating layer 210.

The third adhesive layer 250 may be disposed between the second adhesive layer 230-2 and the protective member 400. The third adhesive layer 250 may have an adhesive property (e.g., a predetermined adhesive property). In the present exemplary embodiment, the third adhesive layer 250 may directly make contact with the second adhesive layer 230-2.

The third adhesive layer 250 may include a flat part 250-H and a protrusion part 250-L protruded from the flat part 250-H. The protrusion part 250-L has an integral shape with the flat part 250-H and protrudes into the through holes TH-3.

In an embodiment, the protrusion part 250-L may make contact with a first adhesive layer 220-2 through the through holes TH-3. Accordingly, a contact area CA-1 may be defined between the third adhesive layer 250 and the first adhesive layer 220-2. The contact area CA-1 has an area equal to or smaller than that of the through holes TH-3 when viewed in a plan view. Since each of the protrusion part 250-L and the first adhesive layer 220-2 has an adhesive force, the third adhesive layer 250 and the first adhesive layer 220-2 may be physically coupled to each other through the through holes TH-3 in the contact area CA-1.

In an embodiment, the third adhesive layer 250 may be disposed between the frame member 500 and the protective member 400. The flat part 250-H of the third adhesive layer 250 extends outward from an edge of the heat radiating layer 210 when viewed in a plan view to overlap with the frame member 500. Accordingly, an additional coupling member may not be needed for the coupling between the frame member 500 and the protective member 400. However, according to another embodiment, the frame member 500 and the protective member 400 may be coupled to each other by a separately provided coupling member.

The heat radiating layer 210 may be stably coupled to the protective substrate 410 by the first adhesive layer 220-2, the second adhesive layer 230-2, and the third adhesive layer 250. Thus, coupling stability between the protective member 400 and the heat radiating member 200-5 may be improved.

Although some exemplary embodiments of the present invention have been described, it is to be understood that the present invention should not be limited to these exemplary embodiments but, rather, various changes and modifications may be made by one of ordinary skill in the art within the spirit and scope of the present invention as claimed herein.

What is claimed is:

1. A display device comprising:
a display panel having a display area and a peripheral area adjacent to the display area;
a heat radiating member disposed under the display panel and comprising a first adhesive layer, a second adhesive layer on the first adhesive layer, and a heat radiating layer between the first adhesive layer and the second adhesive layer; and
a heat generating member on the peripheral area and overlapping the display panel,
wherein a plurality of through holes are defined in the heat radiating layer, and at least some of the plurality of through holes overlap the display area,
wherein the heat generating member is mounted on the display panel, and wherein the heat generating member and the heat radiating member are disposed on different surfaces with the display panel interposed therebetween.

2. The display device of claim 1, wherein the first adhesive layer and the second adhesive layer are connected to each other through the plurality of through holes.

3. The display device of claim 1, further comprising an additional heat generating member which is disposed on an opposite side of the display panel to the heat generating member.

4. The display device of claim 3, wherein the heat radiating member is divided into a plurality of areas in a plan view, and the heat generating member and the additional heat generating member are disposed in different areas.

5. The display device of claim 4, wherein the plurality of through holes is defined in at least one of the plurality of areas.

6. The display device of claim 5, wherein at least one of the heat generating member and the additional heat generating member overlaps the plurality of through holes.

7. The display device of claim 1, wherein the heat radiating member includes a first area overlapping the heat generating member and a second area overlapping the display area.

8. The display device of claim 7, wherein the plurality of through holes is disposed in the second area.

* * * * *